(12) United States Patent
Paek et al.

(10) Patent No.: US 9,219,042 B2
(45) Date of Patent: Dec. 22, 2015

(54) SEMICONDUCTOR DEVICE AND MANUFACTURING METHOD THEREOF

(71) Applicants: Jong Sik Paek, Gyeonggi-do (KR); Doo Hyun Park, Gyeonggi-do (KR)

(72) Inventors: Jong Sik Paek, Gyeonggi-do (KR); Doo Hyun Park, Gyeonggi-do (KR)

(73) Assignee: Amkor Technology, Inc., Tempe, AZ (US)

(*) Notice: Subject to any disclaimer, the term of this patent is extended or adjusted under 35 U.S.C. 154(b) by 0 days.

(21) Appl. No.: 13/758,359

(22) Filed: Feb. 4, 2013

(65) Prior Publication Data

US 2014/0131886 A1 May 15, 2014

(30) Foreign Application Priority Data

Nov. 15, 2012 (KR) .................. 10-2012-0129646

(51) Int. Cl.
*H01L 23/02* (2006.01)
*H01L 23/00* (2006.01)
(Continued)

(52) U.S. Cl.
CPC ............ *H01L 24/11* (2013.01); *H01L 21/6835* (2013.01); *H01L 24/92* (2013.01); *H01L 24/94* (2013.01); *H01L 24/97* (2013.01); *H01L 25/0657* (2013.01); *H01L 25/50* (2013.01); *H01L 21/561* (2013.01); *H01L 21/563* (2013.01); *H01L 21/568* (2013.01); *H01L 23/3135* (2013.01); *H01L 24/02* (2013.01); *H01L 24/03* (2013.01); *H01L 24/05* (2013.01); *H01L 24/13* (2013.01); *H01L 24/16* (2013.01); *H01L 24/17* (2013.01); *H01L 24/81* (2013.01); *H01L 2221/68327* (2013.01); *H01L 2221/68381* (2013.01); *H01L 2224/02372* (2013.01); *H01L 2224/03002* (2013.01); *H01L 2224/036* (2013.01); *H01L 2224/0345* (2013.01); *H01L 2224/0401* (2013.01); *H01L 2224/0557* (2013.01); *H01L 2224/05124* (2013.01); *H01L 2224/05147* (2013.01); *H01L 2224/05155* (2013.01); *H01L 2224/05569* (2013.01); *H01L 2224/05624* (2013.01); *H01L 2224/05644* (2013.01); *H01L 2224/05647* (2013.01); *H01L 2224/06181* (2013.01); *H01L 2224/131* (2013.01); *H01L 2224/13147* (2013.01); *H01L 2224/16146* (2013.01); *H01L 2224/16225* (2013.01); *H01L 2224/17181* (2013.01);
(Continued)

(58) Field of Classification Search
USPC .......................................... 257/686, 777, 778
See application file for complete search history.

(56) References Cited

U.S. PATENT DOCUMENTS 8,421,201 B2 * 4/2013 Lee et al. ...................... 257/686
8,435,835 B2 * 5/2013 Pagaila et al. ................ 438/107
(Continued)

FOREIGN PATENT DOCUMENTS

JP 2011-061205 A 3/2011

OTHER PUBLICATIONS

Korean Final Office Action of the Korean Patent Application No. 10-2012-0129646 (5 pages).

*Primary Examiner* — Sheila V Clark
(74) *Attorney, Agent, or Firm* — McAndrews, Held & Malloy, Ltd.

(57) ABSTRACT

Provided are a semiconductor device and a method of manufacturing the same. A carrier is removed after a first semiconductor die and a second semiconductor die are stacked on each other, and then a first encapsulant is formed, so that the carrier may be easily removed when compared to approaches in which a carrier is removed from a wafer having a thin thickness.

19 Claims, 15 Drawing Sheets

(51) Int. Cl.
  H01L 21/683 (2006.01)
  H01L 25/065 (2006.01)
  H01L 25/00 (2006.01)
  H01L 23/31 (2006.01)
  H01L 21/56 (2006.01)

(52) U.S. Cl.
  CPC ............... *H01L2224/32225* (2013.01); *H01L 2224/73204* (2013.01); *H01L 2224/73253* (2013.01); *H01L 2224/81005* (2013.01); *H01L 2224/81815* (2013.01); *H01L 2224/92* (2013.01); *H01L 2224/92225* (2013.01); *H01L 2224/94* (2013.01); *H01L 2224/97* (2013.01); *H01L 2225/0652* (2013.01); *H01L 2225/06513* (2013.01); *H01L 2225/06517* (2013.01); *H01L 2225/06541* (2013.01); *H01L 2225/06568* (2013.01); *H01L 2924/00014* (2013.01); *H01L 2924/01322* (2013.01); *H01L 2924/15311* (2013.01); *H01L 2924/1659* (2013.01); *H01L 2924/16251* (2013.01); *H01L 2924/18161* (2013.01); *H01L 2924/19105* (2013.01)

(56) References Cited

U.S. PATENT DOCUMENTS

| | | | |
|---|---|---|---|
| 8,803,334 B2* | 8/2014 | Choi et al. | 257/777 |
| 2011/0062592 A1 | 3/2011 | Lee et al. | |
| 2011/0221072 A1* | 9/2011 | Chin | 257/777 |

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2012-0129646, filed on Nov. 15, 2012, the contents of which are hereby incorporated herein by reference in their entirety.

FIELD OF THE INVENTION

The present invention relates to a semiconductor device and a method of manufacturing the same.

BACKGROUND OF THE INVENTION

Generally, semiconductor devices include semiconductor die which are manufactured by processing a wafer to form an integrated circuit on the wafer. Such a semiconductor device has a structure in which a semiconductor die is mounted on a substrate such as a lead frame or a printed circuit board (PCB). Also, a wafer level semiconductor device which is packaged using a wafer itself as a substrate without a separate substrate is also being used.

When semiconductor devices are manufactured, in a situation where a wafer including a plurality of semiconductor die is moved using various equipment, a carrier that adheres to the wafer to fix the wafer and to prevent the wafer from being damaged may be used. Afterwards, the carrier is removed from the wafer after the wafer is divided into the plurality of individual semiconductor die.

In some cases, it may be very difficult to remove the carrier from a wafer having a thin thickness without damaging the wafer. Also, there may be a limitation that the carrier is removed one by one from each of the plurality of semiconductor die, after the wafer is divided into the individual semiconductor die.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A semiconductor device and method of manufacturing a semiconductor device, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
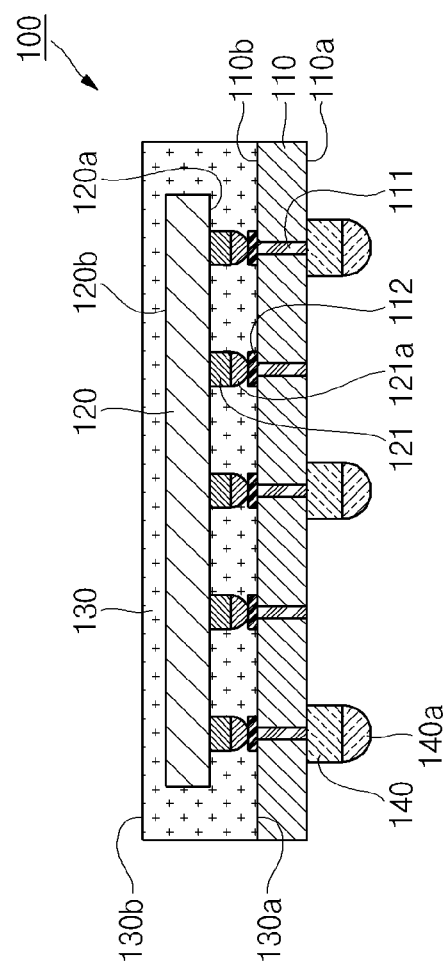
FIG. 1 illustrates a cross-sectional view of an exemplary semiconductor device, in accordance with a representative embodiment of the present invention.

Aspects of the present invention relate to a semiconductor device and a method of manufacturing the same. More specifically, representative embodiments of the present invention may relate to a semiconductor device and a method of manufacturing such a semiconductor device, where the semiconductor device includes a plurality of semiconductor die.

Preferred embodiments of the invention will be described in more detail with reference to the accompanying drawings. In such a manner, those skilled in the art will easily realize the embodiments of the present invention upon a careful reading of the present patent application.

It should be noted that the thickness or size of each layer in the accompanying drawings is exaggerated for clarity, and that like reference numerals refer to like elements. Additionally, the term "semiconductor die" in this specification includes, for example, a semiconductor chip having an active circuit and/or a passive circuit, a semiconductor wafer, or equivalents thereof. In the following description, it will be understood that when one part is electrically connected to another part, the one part can be directly connected to the other part, or intervening parts may also be present.

As utilized herein, the term "exemplary" means serving as a non-limiting example, instance, or illustration. Also, as utilized herein, the term "may" is generally synonymous with the phrase "may, for example", in that such term is generally utilized to present non-limiting example illustrations.

FIG. 1 illustrates a cross-sectional view of an exemplary semiconductor device 100, in accordance with a representative embodiment of the present invention.

Referring now to FIG. 1, it can be seen that the semiconductor device 100 includes a first semiconductor die 110 where a plurality of through electrodes 111 and conductive pads 112 are disposed, a second semiconductor die 120 on which one or more conductive pillars 121 are disposed, a first encapsulant 130 surrounding the second semiconductor die 120, and one or more conductive pillars 140 disposed on the first semiconductor die 110.

In a representative embodiment of the present invention, the first semiconductor die 110 may include a silicon semiconductor, a compound semiconductor, or any suitable equivalent, but is not necessarily limited to a kind of semiconductor. As illustrated in FIG. 1, the first semiconductor die 110 has a plate shape having an approximately flat first surface 110a and an approximately flat second surface 110b opposite to the first surface 110a. The first semiconductor die 110 includes the plurality of through electrodes 111 passing between the first surface 110a and the second surface 110b. Also, the first semiconductor die 110 includes the plurality of conductive pads 112 disposed on the second surface 110b. As shown in FIG. 1, the plurality of conductive pads 112 are electrically connected to the plurality of through electrodes 111, respectively. Each of the through electrodes 111 electrically connects one of the one or more conductive pillars 140 disposed on the first surface 110a to a corresponding one of the conductive pads 112 disposed on the second surface 110b of the first semiconductor die 110. The conductive pads 112 may be provided through a redistribution pattern process, but a representative embodiment of the present disclosure is not necessarily limited in that manner.

In a representative embodiment of the present invention, the second semiconductor die 120 may include a silicon semiconductor, a compound semiconductor, or any suitable equivalent, but is not necessarily limited to a particular kind of semiconductor. As shown in FIG. 1, the second semiconductor die 120 has a plate shape having an approximately flat first surface 120a and an approximately flat second surface 120b opposite to the first surface 120a. The first surface 120a of the second semiconductor die 120 faces the second surface 110b of the first semiconductor die 110. The second semiconductor die 120 of FIG. 1 includes a plurality of conductive pillars 121 on the first surface 120a that are electrically connected to the first semiconductor die 110. The conductive pillars 121 are disposed on the first surface 120a of the second semiconductor die 120 facing the first semiconductor die 110. The conductive pillars 121 may be a copper pillar, but a representative embodiment of the present invention is not necessarily limited to that particular material, and may be fabricated using any suitable material. Each of the conductive pillars 121 may include a solder cap 121a on an end thereof. As shown in FIG. 1, each of the conductive pillars 121 are electrically connected to corresponding conductive pad 112 disposed on the second surface 110b of the first semiconductor die 110. Thus, the second semiconductor die 120 is electrically connected to the first semiconductor die 110. It should be noted that although the illustration of FIG. 1 shows a particular number and arrangement of conductive pillars 121, through electrodes 111, conductive pads 112, conductive pillars 140, and solder caps 121a, this is for reasons of illustration and does not necessarily represent a specific limitation of the present invention, unless explicitly recited in the claims.

In the example of FIG. 1, the first encapsulant 130 covers the second surface 110b of the first semiconductor die 110 and surrounds the second semiconductor die 120 to protect the first and second semiconductor die 110 and 120 against external environments. However, the first surface 110a of the first semiconductor die 110 is exposed to the external environment outside of the first encapsulant 130. That is, the first encapsulant 130 covers the second surface 110b of the first semiconductor die 110 and surrounds the second semiconductor die 120. The first encapsulant 130 has a first surface 130a contacting the second surface 110b of the first semiconductor die 110 and a second surface 130b opposite to the first surface 130a. The first encapsulant 130 may, for example, be formed of an epoxy-based resin that is an electrically non-conductive material.

The one or more conductive pillars 140 are electrically connected to corresponding ones of the through electrodes 111 exposed at the first surface 110a of the first semiconductor die 110. The one or more conductive pillars 140 may be a copper pillar, but a representative embodiment of the present invention is not necessarily limited to that specific material, and may employ any suitable material. The one or more conductive pillars 140 may each include a solder cap 140a on an end thereof.

Therefore, a semiconductor device such as the semiconductor device 100 of FIG. 1, in accordance with a representative embodiment of the present invention may be, for example, manufactured in a flip chip shape. Thus, the semiconductor device 100 having the flip chip shape may be mounted on a mother board or a main board as it is shown in FIG. 1.

Figure 2:
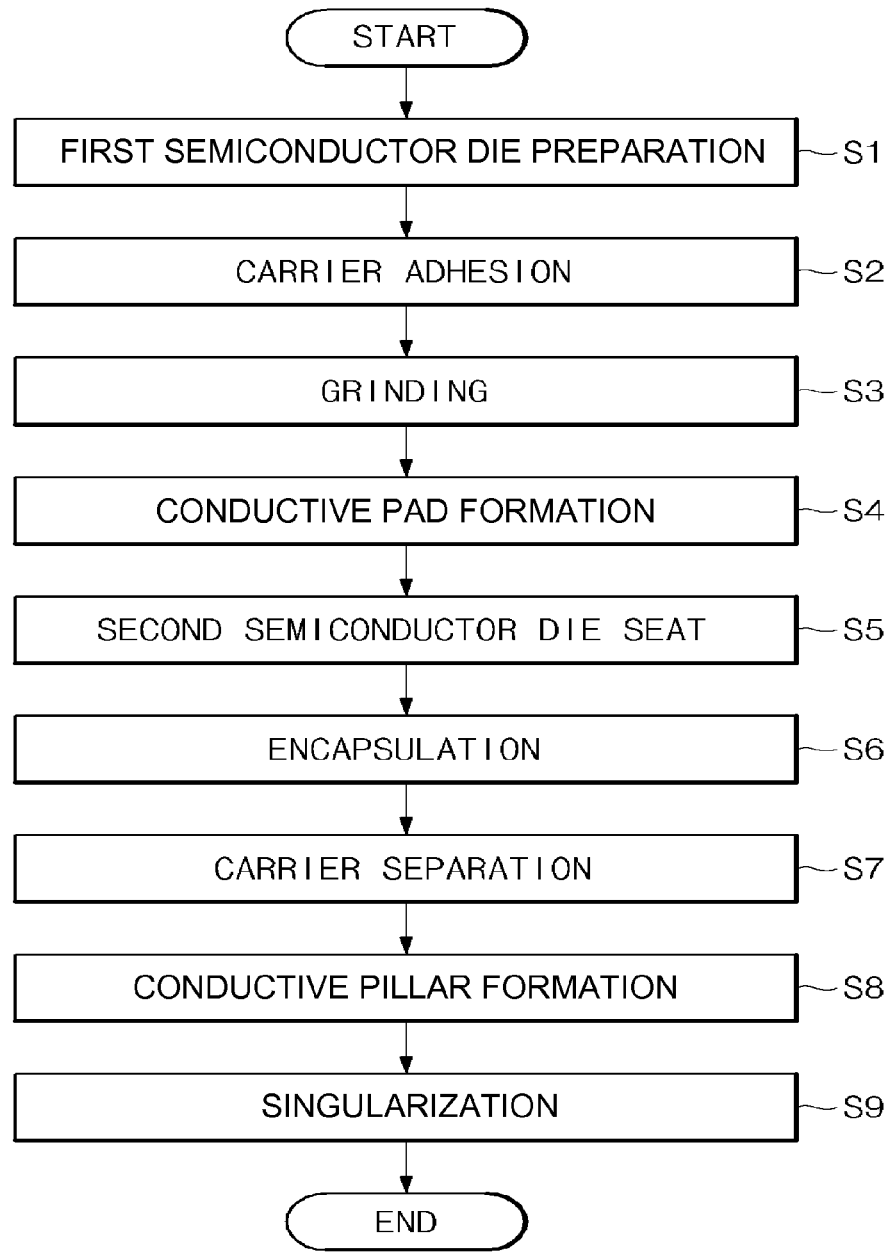
FIG. 2 illustrates a flowchart of an exemplary method of manufacturing the semiconductor device of FIG. 1, in accordance with a representative embodiment of the present invention.

FIG. 2 illustrates a flowchart of an exemplary method of manufacturing the semiconductor device 100 of FIG. 1. Referring to FIG. 2, a method of manufacturing a semiconductor device in accordance with a representative embodiment of the present invention may include a first semiconductor die preparation process S1, a carrier adhesion process S2, a grinding process S3, a conductive pad formation process S4, a second semiconductor die seat process S5, an encapsulation process S6, a carrier separation process S7, an conductive pillar formation process S8, and a singularization process S9.

The exemplary method of manufacturing the semiconductor device 100 will now be described in detail with reference to FIGS. 3A to 3K.

Figure 3A:
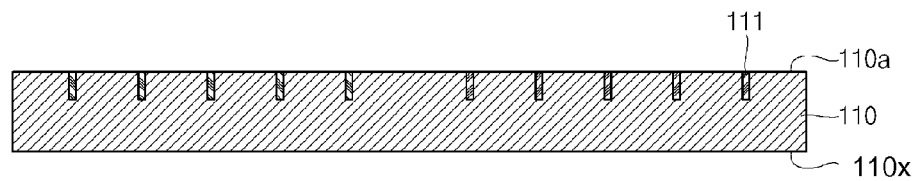
FIGS. 3A to 3K are cross-sectional views of the exemplary semiconductor device of FIG. 1, to assist in explaining the exemplary method of manufacturing the semiconductor device of FIG. 2, in accordance with a representative embodiment of the present invention.

FIG. 3A illustrates a cross-sectional view of an exemplary first semiconductor die preparation process S1 in the exemplary method of manufacturing the semiconductor device 100 illustrated in FIG. 2, in accordance with a representative embodiment of the present invention. In the first semiconductor die preparation process S1, a first semiconductor die (110x) having an approximately flat first surface 110a and an approximately flat second surface 110bx opposite to the first surface 110a and including a plurality of through holes exposed to the first surface 110a is prepared. Here, the first surface 110a of the first semiconductor die 110x is disposed on a top surface of the first semiconductor die 110x, and a second surface 110bx is disposed on a bottom surface of the first semiconductor die 110x. The through electrode 111 is defined as a through hole in the first semiconductor die 110x with a predetermined depth from the first surface 110a of the first semiconductor die 110x. The through holes are not exposed at the second surface 110bx of the first semiconductor die 110x. A through hole may be formed in the first surface 110a of the first semiconductor die 110x, and then a conductive material may be filled into the through hole to form the through electrode 111. It should be noted that the manner of fabrication discussed above and shown in FIG. 3A is not necessarily a specific limitation of the present invention, unless explicitly recited in the claims, and that other suitable fabrication methods may be used. The through electrode 111 may be formed of one or more materials selected from copper (Cu), gold (Au), silver (Ag), aluminum (Al), and any other suitable equivalents, and the identification of these materials here does not necessarily represent a specific limitation of the present invention, unless explicitly recited in the claims.

Figure 3B:
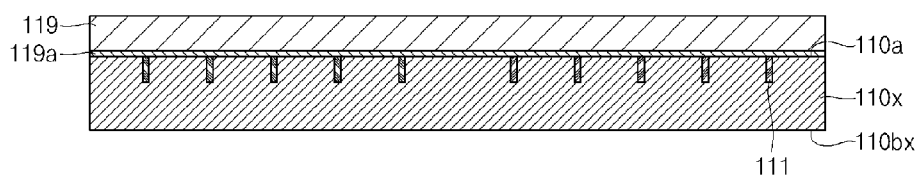

FIG. 3B illustrates a cross-sectional view of an exemplary carrier adhesion process S2 in the exemplary method of manufacturing the semiconductor device 100 of FIG. 2, in accordance with a representative embodiment of the present invention. In the carrier adhesion process S2 illustrated in FIG. 3B, a carrier 119 temporarily adheres to cover the first surface 110a of the first semiconductor die 110x. In some representative embodiments of the present invention, the carrier 119 temporarily adheres to the first semiconductor die 110x by means of an adhesive 119a. The carrier 119 may adhere to fix the first semiconductor die 110x and prevent the first semiconductor die 110x from being damaged when the first semiconductor die 110x is moved by equipment for each process in following processes.

Figure 3C:
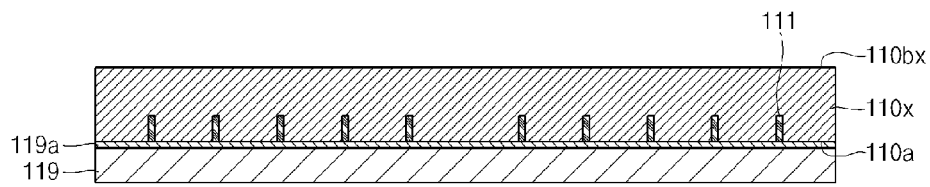
Figure 3D:
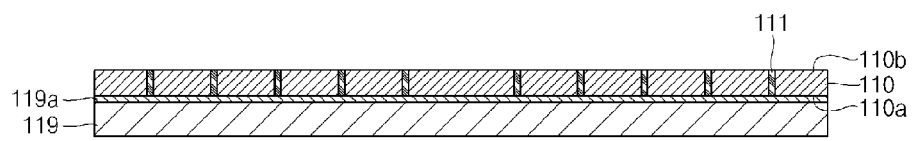

FIGS. 3C and 3D illustrate cross-sectional views of an exemplary grinding process S3 in the exemplary method of manufacturing the semiconductor device 100 of FIG. 2, in accordance with a representative embodiment of the present invention. In the grinding process S3, as shown in FIG. 3C, the carrier 119 to which a first semiconductor die 110x adheres is overturned to allow the second surface 110bx of the first semiconductor die 110x to be disposed facing an upper side. That is, the first semiconductor die 110x is disposed at an upper position, and the carrier 119 is disposed at a lower position. Thereafter, in the grinding process S3, as shown in FIG. 3D, the second surface 110bx of the first semiconductor die 110x is ground to remove a portion of the first semiconductor die 110x so that the through electrode 111 is exposed to a second surface 110b of the thinned first semiconductor die 110. Thus, the first semiconductor die 110 of FIG. 3D may have a thickness according to the specifications of the semiconductor device 100. For example, the grinding method may be performed using a diamond grinder or any suitable equivalent, and the use of grinding may be replaced by any other suitable method of removing the material of the first semiconductor die 110x to produce the thinned first semiconductor die 110, and exposing the through electrodes 111, as known now or in the future.

Figure 3E:
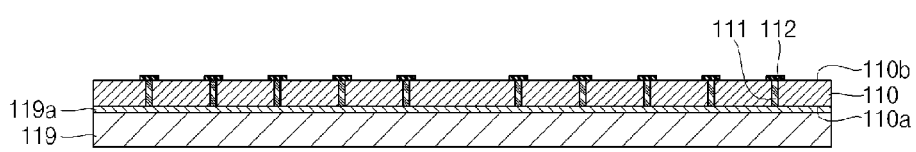

FIG. 3E illustrates a cross-sectional view of an exemplary conductive pad formation process S4 in the exemplary method of manufacturing the semiconductor device 100 of FIG. 2, in accordance with a representative embodiment of the present invention. In the conductive pad formation process S4 of FIG. 3E, one or more conductive pads 112 are formed on the second surface 110b of the first semiconductor die 110. As shown in FIG. 3E, the one or more conductive pads 112 are electrically connected to corresponding through electrodes 111 that are exposed at the second surface 110b of the first semiconductor die 110. In a representative embodiment of the present invention, the one or more conductive pads 112 may be formed of copper, aluminum, or a suitable equivalent, and the particular materials identified here do not necessarily represent specific limitations of the present invention, unless explicitly recited in the claims. The one or more conductive pads 112 may, for example, be formed by using sputtering, vacuum deposition, photo lithography, or any other suitable process known now or in the future.

Figure 3F:
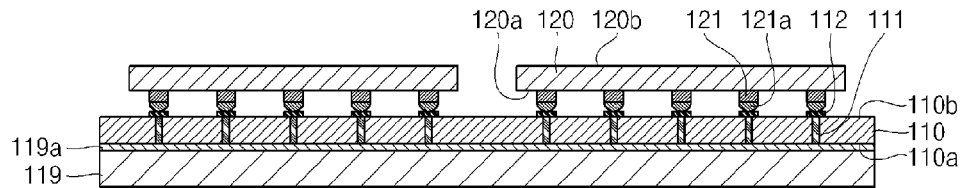

FIG. 3F illustrates a cross-sectional view of an exemplary second semiconductor die seat process S5 in the exemplary method of manufacturing the semiconductor device 100 of FIG. 2, in accordance with a representative embodiment of the present invention. In the second semiconductor die seat process S5 shown in FIG. 3F, a semiconductor die 120 including one or more conductive pillars 121 is seated on the second surface 110b of the first semiconductor die 110. As shown in FIG. 3F, the one or more conductive pads 112 of the first semiconductor die 110 are electrically connected to corresponding conductive pillars 121 of the second semiconductor die 120. In a representative embodiment of the present invention, a solder cap 121a formed on an end of the one or more conductive pillars 121 is melted, the one or more conductive pillars 121 are, thus, connected to the conductive pads 112. In this manner, the second semiconductor die 120 is seated on the first semiconductor die 110 and is electrically connected to the first semiconductor die 110.

Figure 3G:
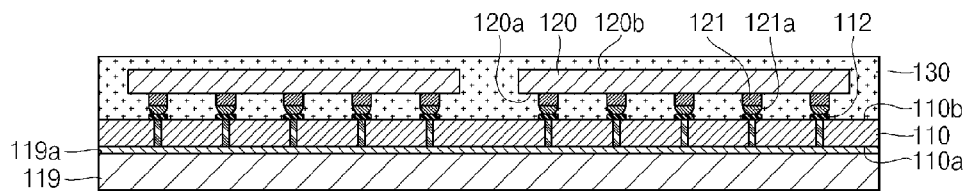

FIG. 3G illustrates a cross-sectional view of an exemplary encapsulation process S6 in the exemplary method of manufacturing the semiconductor device 100 of FIG. 2, in accordance with a representative embodiment of the present invention. In the encapsulation process S6 of FIG. 3G, the second surface 110b of the first semiconductor die 110 may be covered by, and the second semiconductor die 120 may be encapsulated and surrounded by, a first encapsulant 130. The first encapsulant 130 may electrically protect the one or more conductive pads 112 of the first semiconductor die 110 and the one or more conductive pillars 121 of the second semiconductor die 120. In the encapsulation process S6 of FIG. 3G, when the first encapsulant 130 is formed, the first encapsulant 130 may, for example, be cured by thermal treatment, or using any other suitable means.

Figure 3H:
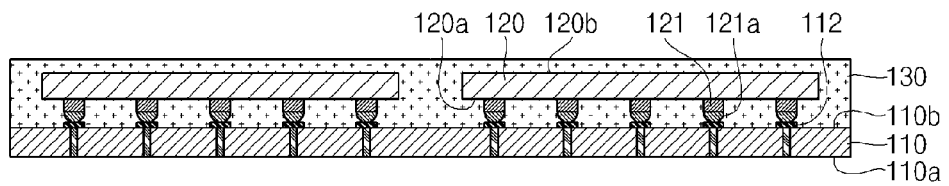

FIG. 3H illustrates a cross-sectional view of an exemplary carrier separation process S7 in the exemplary method of manufacturing the semiconductor device 100 of FIG. 2, in accordance with a representative embodiment of the present invention. In the carrier separation process S7 of FIG. 3H, the carrier 119 temporarily adhering to the first surface 110a of the first semiconductor die 110 in the carrier adhesion process S2 is separated. The carrier 119 may be separated from the first semiconductor die 110 after a predetermined stimulation is applied into the adhesive 119a to reduce strength of adhesiveness. The adhesive 119a of the carrier 119 may be reduced in adhesiveness by, for example, the thermal treatment performed for curing the first encapsulant 130 in the encapsulation process S6, but this does not necessarily represent a specific limitation of the present invention, unless explicitly recited in the claims. Also, in the carrier separation process S7 illustrated in FIG. 3H, the carrier 119 may be separated and removed to expose the first surface 110a of the first semiconductor die 110 to the outside environment.

Figure 3I:
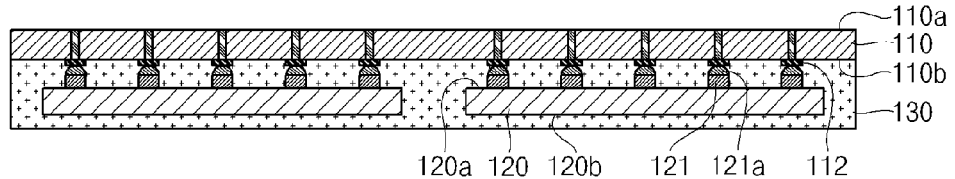
Figure 3J:
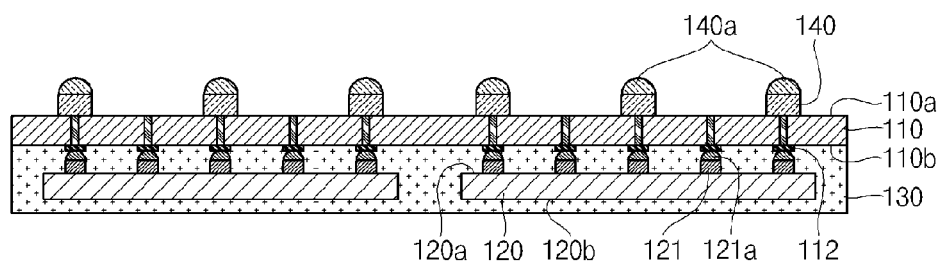

FIGS. 3I and 3J illustrate cross-sectional views of an exemplary conductive pillar formation process S8 in the exemplary method of manufacturing the semiconductor device 100 of FIG. 2, in accordance with a representative embodiment of the present invention. In the conductive pillar formation process S8, as shown in FIG. 3I, the first encapsulant 130 covering the second surface 110b of the first semiconductor die 110 is overturned to allow the first surface 110a of the first semiconductor die 110 to be disposed facing an upper side. That is, the first semiconductor die 110 is disposed on an upper side, and the second semiconductor die 120 and the first encapsulant 130 are disposed on a lower side. In a representative embodiment of the present invention, the first encapsulant 130 may function as a carrier for fixing the first semiconductor die 110 and the second semiconductor die 120 when the first and second semiconductor die 110x and 120 are moved using equipment for each portion of the process. Also, in the conductive pillar formation process S8, as shown in FIG. 3J, one or more conductive pillars 140 may be formed on the first surface 110a of the first semiconductor die 110 disposed on the upper side. The one or more conductive pillars 140 may, for example, be a copper pillar. In a representative embodiment of the present invention, a corresponding solder cap 140a may be further formed on an end of each of the one or more conductive pillars 140.

Figure 3K:
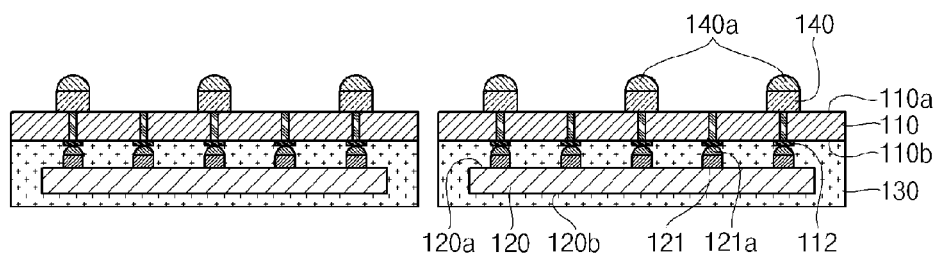

FIG. 3K illustrates a cross-sectional view of an exemplary singularization process S9 in the exemplary method of manufacturing the semiconductor device 100 of FIG. 1, in accordance with a representative embodiment of the present invention. In the singularization process S9 of FIG. 2, a wafer comprising a plurality of semiconductor devices is diced into individual semiconductor devices 100 by using a dicing tool (not shown) such as, for example, a diamond wheel, a laser beam, or any suitable means known now or in the future.

As described above, in the exemplary method of manufacturing the semiconductor device 100, the second semiconductor die 120 may be stacked on the first semiconductor die 110, and the first encapsulant 130 may be formed. Then, the carrier 119 may be removed. Thus, the carrier 119 may be easily removed, as compared to when that a carrier is removed from a wafer having a thin thickness. Also, in the method of manufacturing the semiconductor device 100, since the carrier 119 is removed before the semiconductor devices are separated from each other, the carrier 119 may be easily removed when compared that a carrier 119 is removed after semiconductor devices are separated from each other.

Figure 4:
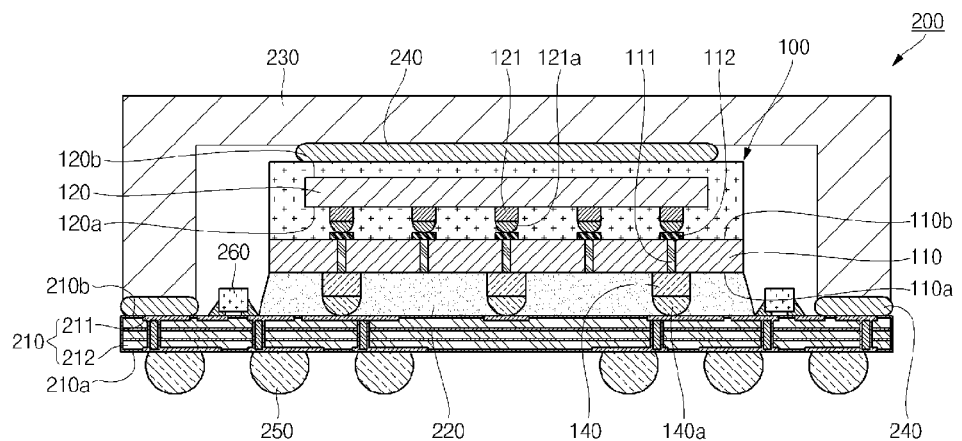
FIG. 4 illustrates a cross-sectional view of another exemplary semiconductor device, in accordance with a representative embodiment of the present invention.

FIG. 4 illustrates a cross-sectional view of an exemplary semiconductor device 200, in accordance with a representative embodiment of the present invention. Referring to FIG. 4, the semiconductor device 200 in accordance with a representative embodiment of the present invention may include a semiconductor device 100, a circuit board 210, an under fill 220, a cover 230, a thermally conductive adhesive 240 (or other thermally conductive material), and one or more solder balls 250. The semiconductor device 100 has the configuration similar to that of the semiconductor device 100 of FIG. 1, and thus, may be referred to herein as a flip chip device. Note that utilization of the phrase "flip chip device" herein is merely for non-limiting illustrative purposes and should not limit the scope of various aspects of the present invention unless explicitly claimed.

The flip chip device 100 includes one or more conductive pillars 140 exposed to one surface thereof. As shown in the example of FIG. 4, the one or more conductive pillars 140 are mounted on a second surface 210b of the circuit board 210.

The circuit bard 210 includes a circuit pattern and an insulation layer 212. Furthermore, a passive device 260 may be mounted on the circuit board 210. Also, as described above, the one or more conductive pillars 140 of the flip chip device 100 are electrically connected to the circuit pattern 211 of the circuit board 210.

The under fill 220 is formed between the flip chip device 100 and the circuit board 210. That is, the under fill 220 is disposed on the circuit board 210 to surround the one or more conductive pillars 140 as well as the first surface 110a of the first semiconductor die 110 of the flip chip device 100. Thus, the under fill 220 may prevent the flip chip device 100 and the circuit board 210 from being separated from each other by any stress that may be due to a difference in the coefficient of thermal expansion between the flip chip device 100 and the circuit board 210.

The cover 230 is attached to a second surface 210b of the circuit board 210 to surround the flip chip device 100. Thus, the flip chip device 100 may be protected against external environments by the cover 230. The cover 230 may be formed of a metal, ceramic, or any suitable equivalent to improve heat dissipation performance. The materials indicated above do not necessarily represent a specific limitation of the present invention, as other materials may be used for the cover 230 without departing from the spirit and scope of the present invention.

In a representative embodiment of the present invention, thermally conductive adhesive 240 may be disposed between the flip chip device 100 and the cover 230, and between the cover 230 and the second surface 210b of the circuit board 210. The thermally conductive adhesive 240 may quickly transfer heat generated from the flip chip device 100 into the cover 230. Also, the thermally conductive adhesive 240 may act to fix the cover 230 to the flip chip device 100 and the circuit board 210.

The one or more solder balls 250 of FIG. 4 may be disposed on a first surface 210a of the circuit board 210 opposite to the second surface 210b on which the flip chip device 100 is mounted. That is, the one or more solder balls 250 may be electrically connected to the circuit pattern 211 of the circuit board 210. Due to the presence of the one or more solder balls 250, a semiconductor device in accordance with a representative embodiment of the present invention, such as the semiconductor device 200, may, for example, be mounted on a mother board or main board of electronic equipment such as a computer, a smart phone, and the like.

Figure 5:
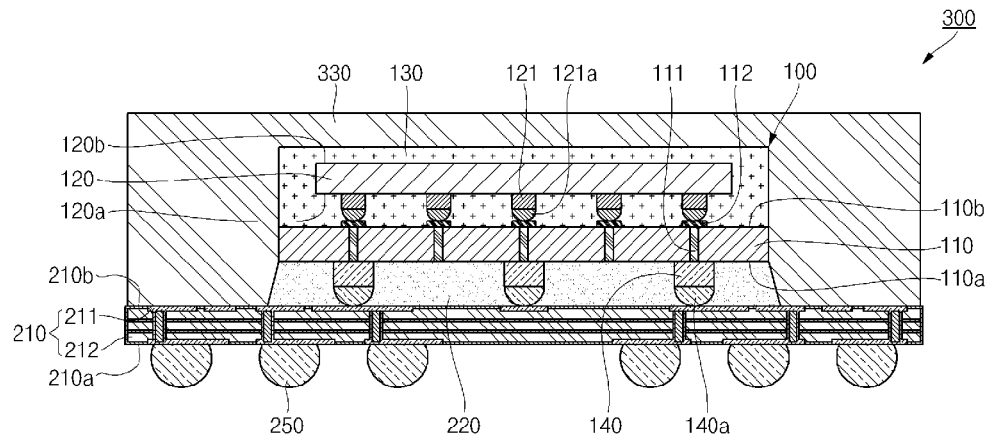
FIG. 5 illustrates a cross-sectional view of yet another semiconductor device, in accordance with a representative embodiment of the present invention.

FIG. 5 illustrates a cross-sectional view of yet another exemplary semiconductor device 300, in accordance with a representative embodiment of the present invention. Referring to FIG. 5, the semiconductor device 300 includes a flip chip device 100, a circuit board 210, an under fill 220, a second encapsulant 330, and one or more solder balls 250.

The flip chip device 100, the circuit board 210, the under fill 220, and the one or more solder balls 250 of the semiconductor device 400 may, for example, correspond to the similarly numbered elements of the semiconductor device 200 of FIG. 4. Thus, the second encapsulant 330 of the semiconductor device 300, which is different in configuration from the semiconductor device 200 of FIG. 4, will be mainly described.

The second encapsulant 330 is disposed in a manner to surround the flip chip device 100, the under fill 220, and a second surface 210b of the circuit board 210. That is, the second encapsulant 330 protects the flip chip device 100 and the circuit board 210 against external environments. Here, a first surface 210a of the circuit board 210 is exposed to the outside of the second encapsulant 330. That is, a surface of the circuit board 210 on which the solder ball 250 is disposed is exposed to the outside. In the representative embodiment of the present invention shown in FIG. 5, the second encapsulant 330 may, for example, be formed of an epoxy-based resin that is an electrically non-conductive material.

Figure 6:
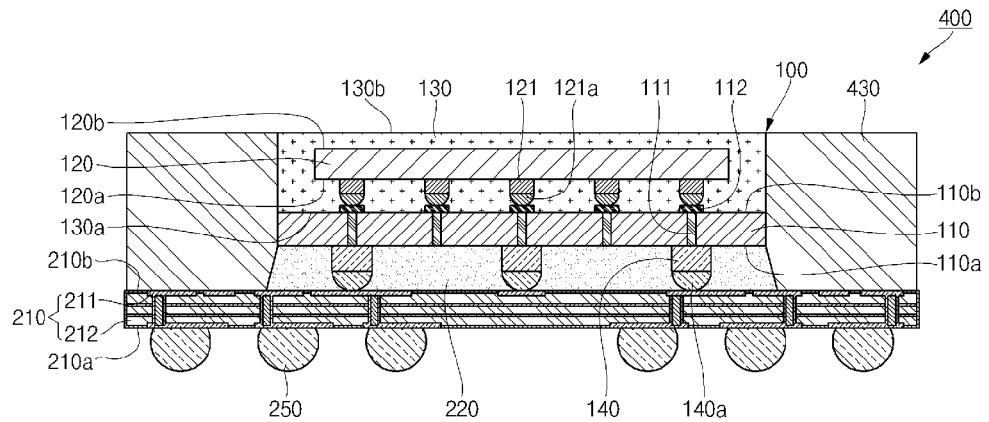
FIG. 6 illustrates a cross-sectional view of still another exemplary semiconductor device, in accordance with a representative embodiment of the present invention.

FIG. 6 illustrates a cross-sectional view of still another exemplary semiconductor device 400, in accordance with a representative embodiment of the present invention. Referring to FIG. 6, the semiconductor device 400 includes a flip chip device 100, a circuit board 210, an under fill 220, a second encapsulant 430, and one or more solder balls 250.

The flip chip device 100, the circuit board 210, the under fill 220, and the solder balls 250 of the semiconductor device 400 may correspond to those similarly numbered elements of the semiconductor device 300 of FIG. 5. Thus, the second encapsulant 430 of the semiconductor device 400, which is different in configuration from the semiconductor device 300 of FIG. 5, will be mainly descried.

The second encapsulant 430 is disposed in a manner to surround the flip chip device 100, the under fill 220, and a second surface 210b of the circuit board 210. In the representative embodiment of the present invention illustrated in FIG. 6, a second surface 130b of the first encapsulant 130 is exposed to the external environment outside of the second encapsulant 430. Also, a first surface 210a of the circuit board 210 on which the one or more solder balls 250 are disposed is also exposed to the external environment outside of the second encapsulant 430. That is, the second encapsulant 430 is disposed in a manner to surround a side surface of the flip chip device 100, the under fill 220, and the second surface 210b of the circuit board 210, thereby protecting the flip chip device 100 and the circuit board 210 against external environments. The second encapsulant 430 may, for example, be formed an epoxy-based resin that is an electrically non-conductive material.

Figure 7:
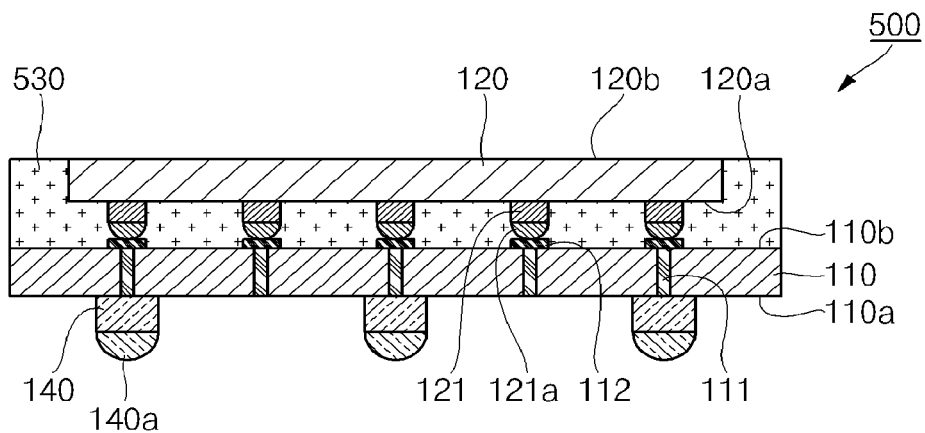
FIG. 7 illustrates a cross-sectional view of an exemplary semiconductor device, in accordance with a representative embodiment of the present invention.

FIG. 7 illustrates a cross-sectional view of an exemplary semiconductor device, in accordance with a representative embodiment of the present invention.

Referring to FIG. 7, the semiconductor device 500 includes a first semiconductor die 110 where a plurality of through electrodes 111 and one or more conductive pads 112 are disposed, a second semiconductor die 120 on which one or more conductive pillars 121 is disposed, a first encapsulant 530 surrounding a first surface 120a of the second semiconductor die 120, and one or more conductive pillars 140 disposed on the first semiconductor die 110.

The first semiconductor die 110, the second semiconductor die 120, and the conductive pillars 140 of the semiconductor device 500 may correspond to those elements of the semiconductor device 100 of FIG. 1. Thus, the first encapsulant 530 of the semiconductor device 500, which is different in configuration from the semiconductor device 100 of FIG. 1, will be mainly described.

The first encapsulant 530 is disposed in a manner to cover a second surface 110b of the first semiconductor die 110, the first surface 120a and the edges of the second die 120, and surround the conductive pillars 121. That is, the first encapsulant 530 is disposed between the second surface 110b of the first semiconductor die 110 and the first surface 120a of the second semiconductor die 120. The first encapsulant 530 protects electrical connections between the second surface 110b of the first semiconductor die 110 and the first surface 120a of the second semiconductor die 120 against external environments. Also, a first surface 110a of the first semiconductor die 110 and a second surface 120b of the second semiconductor die 120 are exposed to the external environment outside of the first encapsulant 530. The first encapsulant 530 may, for example, be formed of an epoxy-based resin that is an electrically non-conductive material.

Figure 8:
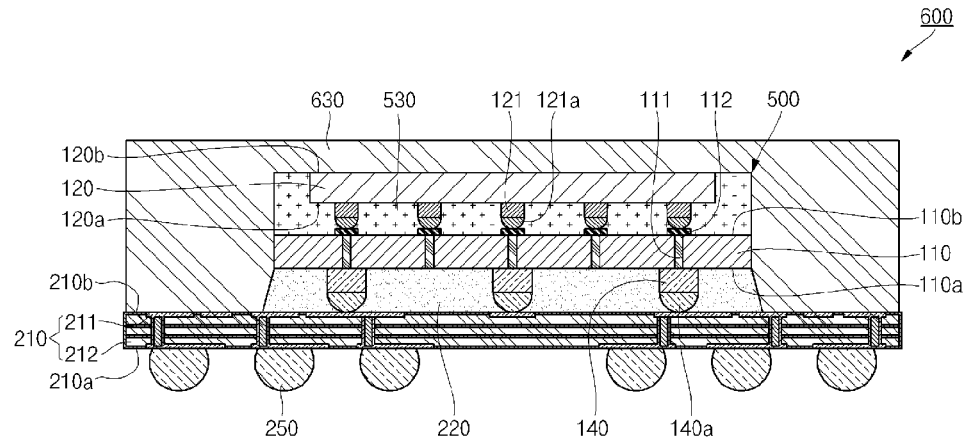
FIG. 8 illustrates a cross-sectional view of another exemplary semiconductor device, in accordance with a representative embodiment of the present invention.

FIG. 8 illustrates a cross-sectional view of an exemplary semiconductor device 600, in accordance with another representative embodiment of the present invention. Referring to FIG. 8, the semiconductor device 600 includes a semiconductor device 500, a circuit board 210, an under fill 220, and one or more solder balls 250. The semiconductor device 500 has a configuration similar to that of the semiconductor device 500 of FIG. 7, and thus, will be referred to herein as a flip chip device.

The flip chip device 500 includes one or more conductive pillars 140 exposed to one surface thereof. The conductive pillars 140 are mounted on a second surface 210b of the circuit board 210.

The circuit bard 210 includes a circuit pattern 211 and an insulation layer 212. As described above, the conductive pillars 140 of the flip chip device 500 are electrically connected to the circuit pattern 211 of the circuit board 210.

The under fill 220 is formed between the flip chip device 500 and the circuit board 210. That is, the under fill 220 is disposed on the circuit board 210 in a manner to surround the conductive pillars 140 as well as cover a first surface 110a of a first semiconductor die 110 of the flip chip device 500. Thus, the under fill 200 may prevent the flip chip device 500 and the circuit board 210 from being separated from each other by any stresses due to a difference in the coefficients of thermal expansion of the flip chip device 500 and the circuit board 210.

A second encapsulant 630 is disposed in a manner to surround the flip chip device 500, the under fill 220, and cover a second surface 210b of the circuit board 210. That is, the second encapsulant 630 protects the flip chip device 500 and the circuit board 210 against external environments. Here, a first surface 210a of the circuit board 210 is exposed to the external environment outside of the second encapsulant 630. That is, a surface of the circuit board 210 on which the solder balls 250 are disposed is exposed to the external environment outside of the semiconductor device 600. The second encapsulant 630 may, for example, be formed an epoxy-based resin that is an electrically non-conductive material.

The one or more solder balls 250 are disposed on a first surface 210a of the circuit board 210 opposite to the second surface 210b on which the flip chip device 500 is mounted. In the representative embodiment of the present invention illustrated in FIG. 8, the solder balls 250 are electrically connected to the circuit pattern 211 of the circuit board 210. Due to the presence of the one or more solder balls 250, the semiconductor device 600 according to this representative embodiment of the present invention may be mounted, for example, on a mother board or main board of electronic equipment such as a computer, a smart phone, and the like.

Figure 9:
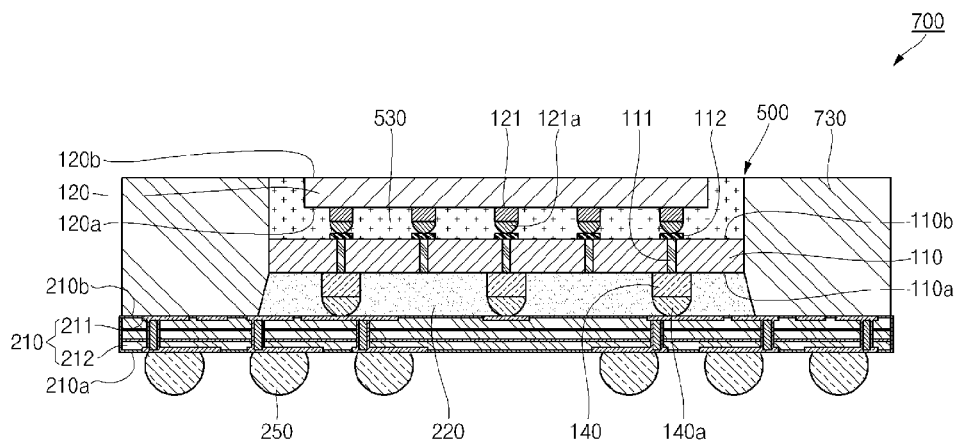
FIG. 9 illustrates a cross-sectional view of an exemplary semiconductor device, in accordance with yet another representative embodiment of the present invention.

FIG. 9 illustrates a cross-sectional view of an exemplary semiconductor device 700, in accordance with yet another representative embodiment of the present invention. Referring to FIG. 9, the semiconductor device 700 includes a flip chip device 500, a circuit board 210, an under fill 220, a second encapsulant 730, and one or more solder balls 250.

The flip chip device 500, the circuit board 210, the under fill 220, and the solder balls 250 of the semiconductor device 700 may correspond to similarly numbered elements of the semiconductor device 600 of FIG. 8. Thus, the second encapsulant 730 of the semiconductor device 700, which is different in configuration from the semiconductor device 600 of FIG. 8, will be mainly described.

In the illustration of FIG. 9, the second encapsulant 730 is disposed in a manner to surround the flip chip device 500, the under fill 220, and cover portions of a second surface 210b of the circuit board 210. Here, a second surface 120b of a second semiconductor die 120 of the flip chip device 500 is exposed to the external environment outside of the second encapsulant 730. Also, a first surface 210a of the circuit board 210 on which the solder balls 250 are disposed is also exposed to the external environment outside. That is, the second encapsulant 730 is disposed in a manner to cover a side surface of the flip chip device 500, the under fill 220, and the second surface 201b of the circuit board 210, thereby protecting the flip chip device 500 and the circuit board 210 against external environments. The second encapsulant 730 may, for example, be formed an epoxy-based resin that is an electrically non-conductive material.

Figure 10:
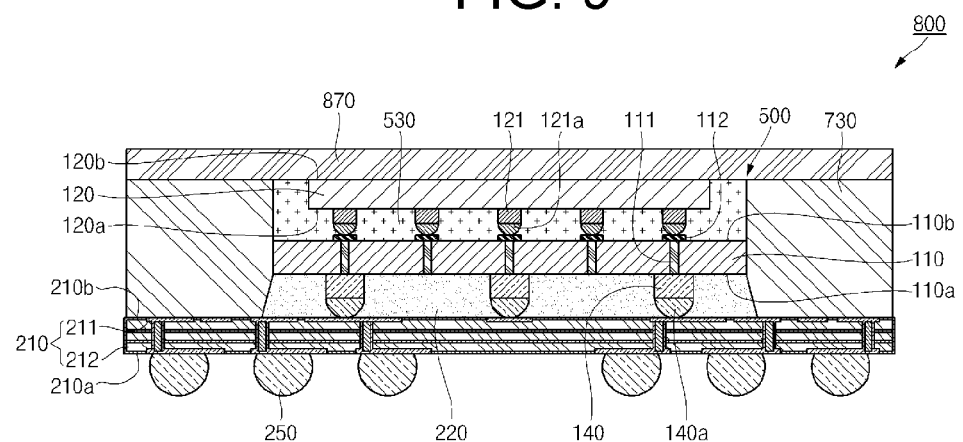
FIG. 10 illustrates a cross-sectional view of an exemplary semiconductor device, in accordance with a representative embodiment of the present invention.

FIG. 10 illustrates a cross-sectional view of an exemplary semiconductor device 800, in accordance with another representative embodiment of the present invention. Referring to FIG. 10, the semiconductor device 800 includes a flip chip device 500, a circuit board 210, an under fill 220, a second encapsulant 730, one or more solders ball 250, and a cover 870.

The flip chip device 500, the circuit board 210, the under fill 220, the second encapsulant 730, and the solder balls 250 of the semiconductor device 800 may correspond to the similarly numbered elements of the semiconductor device 700 of FIG. 9. Thus, the cover 870 of the semiconductor device 800, which is different in configuration from the semiconductor device 700 of FIG. 9, will be mainly described.

The cover 870 is attached to a second surface 120b of a second semiconductor die 120 of the flip chip device 500. That is, the cover 870 is attached to the second surface 120b of the second semiconductor die 120 exposed to the outside of the second encapsulant 730. Thus, the second semiconductor die 120 of the flip chip device 500 may be protected against external environments by the cover 870. The cover 870 may, for example, be formed of a metal, ceramic, or any suitable equivalent to improve heat dissipation performance, but this aspect does not necessarily represent a specific limitation of a representative embodiment of the present invention, unless explicitly recited in the claims. The cover 870 may be attached to the second surface 120b of the second semiconductor die 120 of the flip chip device 500 using, for example, a thermally conductive adhesive (not shown).

Figure 11:
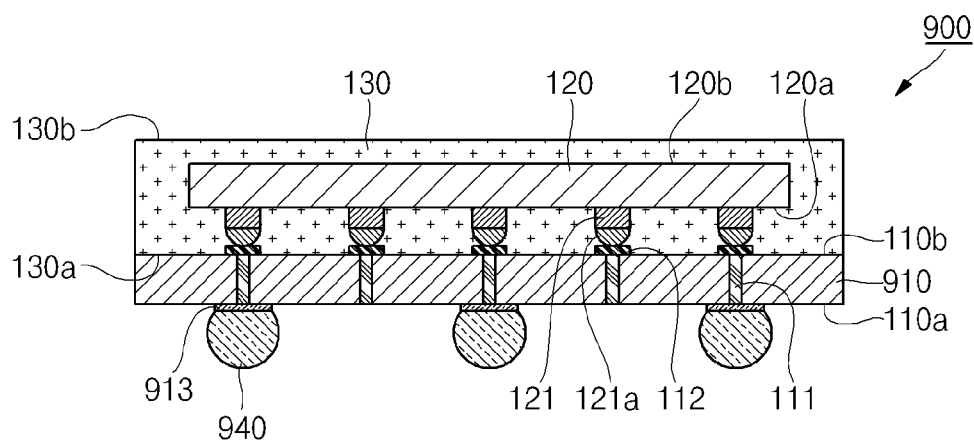
FIG. 11 illustrates a cross-sectional view of an exemplary semiconductor device, in accordance with a representative embodiment of the present invention.

FIG. 11 illustrates a cross-sectional view of an exemplary semiconductor device 900, in accordance with another representative embodiment of the present invention. Referring to FIG. 11, the semiconductor device 900 includes a first semiconductor die 910, a second semiconductor die 120, a first encapsulant 130, and one or more conductive bumps 940. The semiconductor device 900 is similar in many ways to the semiconductor device 100, and includes one or more under bump metals 913 of the first semiconductor die 910 and the conductive bumps 940. Thus, the under bump metals 913 of the first semiconductor die 910 and the conductive bumps 940 in the semiconductor device 900 will be mainly described.

The first semiconductor die 910 includes one or more under bump metals 913 disposed on a first surface 110a of the first semiconductor die 910. In a representative embodiment of the present invention, each of the one or more under bump metals 913 may be electrically connected to a corresponding through electrode 111 exposed at the first surface 110a of the first semiconductor die 910. That is, each of the through electrodes 111 may electrically connect the corresponding under bump metal 913 disposed on the first surface 110a of the first semiconductor die 910 to a corresponding conductive pad 112 disposed on a second surface 110b of the first semiconductor die 110.

The conductive bumps 940 are disposed on the first surface 110a of the first semiconductor die 910. The conductive bumps 940 are electrically connected to the under bump metal 913 disposed on the first surface 110a of the first semiconductor die 910. The conductive bumps 940 may, in some representative embodiments of the present invention, be a solder bump. Also, the one or more conductive bumps 940 may, for example, be formed of one selected from an eutectic solder (Sn37Pb), a high lead solder (Sn95Pb), and a lead-free solder (SnAg, SnAu, SnCu, SnZn, SnZnBi, SnAgCu, SnAgBi, and the like), or any other suitable material. It should be noted, however, that the materials listed here do not necessarily represent specific limitations of a representative embodiment of the present invention, unless explicitly recited in the claims.

Therefore, the semiconductor device 900 according to a representative embodiment of the present invention may be, for example, manufactured in a flip chip configuration. Thus, the semiconductor device 900 having the flip chip configuration may be mounted on, for example, a mother board or a main board, as it is.

Figure 12:
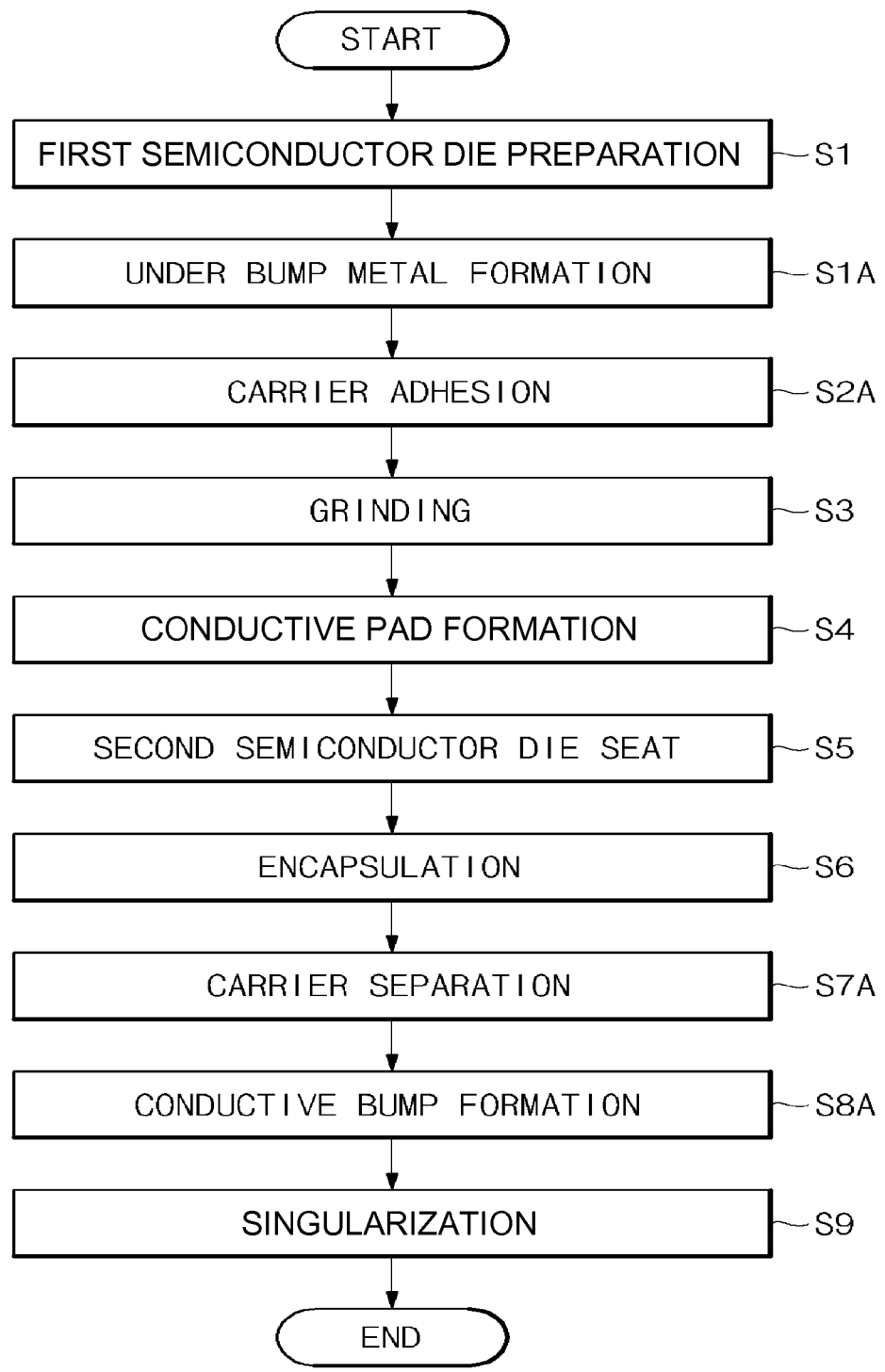
FIG. 12 illustrates a flowchart of an exemplary method of manufacturing the exemplary semiconductor device of FIG. 11, in accordance with a representative embodiment of the present invention.

FIG. 12 illustrates a flowchart of an exemplary method for manufacturing the semiconductor device of FIG. 11, in accordance with a representative embodiment of the present invention. Referring to FIG. 12, the method of manufacturing a semiconductor device includes a first semiconductor die preparation process S1, an under bump metal formation process S1A, a carrier adhesion process S2A, a grinding process S3, a conductive pad formation process S4, a second semiconductor die seat process S5, an encapsulation process S6, a carrier separation process S7A, a conductive bump formation process S8A, and a singularization process S9.

The exemplary method of manufacturing the semiconductor device 900 will be described in detail with reference to FIGS. 13A to 13L.

Figure 13A:
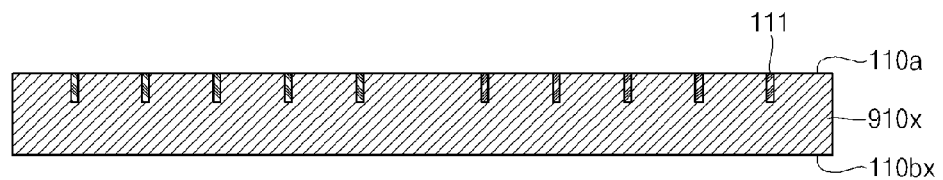
FIGS. 13A to 13L are cross-sectional views that may correspond to the exemplary semiconductor device of FIG. 12, to assist in explaining the method of manufacturing the semiconductor device of FIG. 12, in accordance with a representative embodiment of the present invention.

FIG. 13A illustrates a cross-sectional view of the first semiconductor die preparation process S1 in the method of manufacturing the semiconductor device 900. The first semiconductor die preparation process S1 may, for example, correspond to the semiconductor die preparation process S1 of FIGS. 2 and 3A.

Figure 13B:
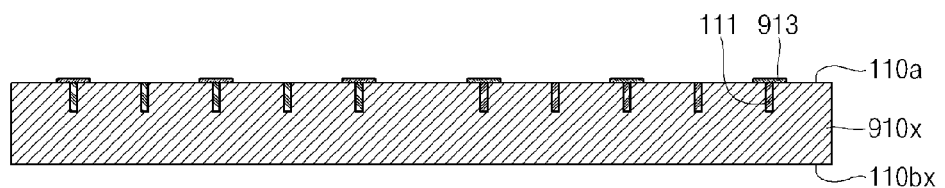

FIG. 13B illustrates a cross-sectional view of an exemplary under bump metal formation process S1A in the method of manufacturing the semiconductor device 900, in accordance with a representative embodiment of the present invention. In the under bump metal formation process S1A of FIG. 13A, one or more under bump metals 913 are formed on a first surface 110a of a first semiconductor die 910x. In more detail, one or more of the under bump metals 913 may be electrically connected to a corresponding through electrode 111 exposed at the first surface 110a of the first semiconductor die 910x. The material of the one or more under bump metals 913 may include, for example, a gold layer, a nickel layer and a copper layer, or gold layer, a nickel layer, and an aluminum layer, which may be sequentially stacked on each other. It should be noted that the materials listed above do not necessarily represent specific limitations of a representative embodiment of the present invention, unless explicitly recited in the claims, in that any suitable materials and layer may be employed without departing from the spirit and scope of the present invention.

Figure 13C:
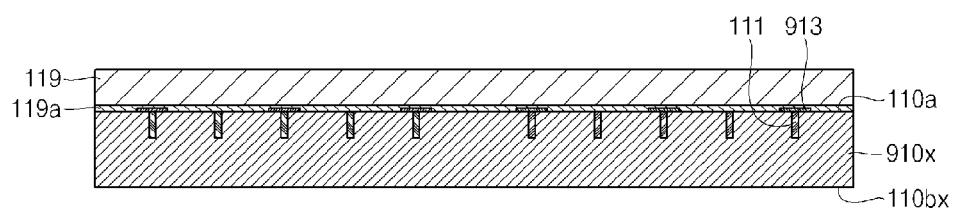

FIG. 13C illustrates a cross-sectional view of an exemplary carrier adhesion process S2A in the method of manufacturing the semiconductor device 900, in accordance with a representative embodiment of the present invention. In the carrier adhesion process S2A of FIG. 13C, a carrier 119 may temporarily adhere to cover the first surface 110a of the first semiconductor die 910x. The carrier 119 temporarily adheres to the first surface 110a of the first semiconductor die 910x by an adhesive 119a to cover the one or more under bump metals 913. The carrier 119 may adhere to fix the first semiconductor die and prevent the first semiconductor die 910x from being damaged when the first semiconductor die 910x is moved by equipment for the various processes in the method.

Figure 13D:
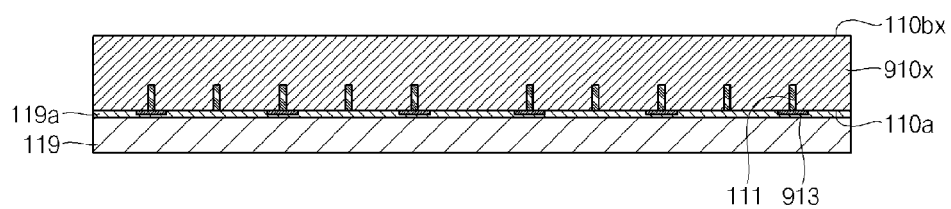
Figure 13E:
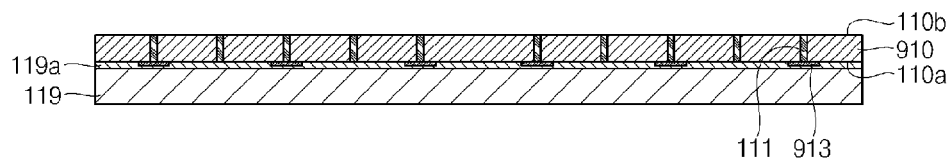

FIGS. 13D and 13E illustrate cross-sectional views of an exemplary grinding process S3 in the method of manufacturing the semiconductor device 900, in accordance with a representative embodiment of the present invention. The grinding process S3 may correspond to the grinding process S3 of the semiconductor device 100 illustrated in FIGS. 3C and 3D. It should be noted that although a grinding process is described with respect to FIGS. 3C, 3D, 13D, and 13E, use of grinding does not necessarily represent a specific limitation of the present invention, unless explicitly recited in the claims, as any other suitable means of reducing the thickness of the first semiconductor die 910x, known now or in the future, may be employed without departing from the spirit and scope of the present invention.

Figure 13F:
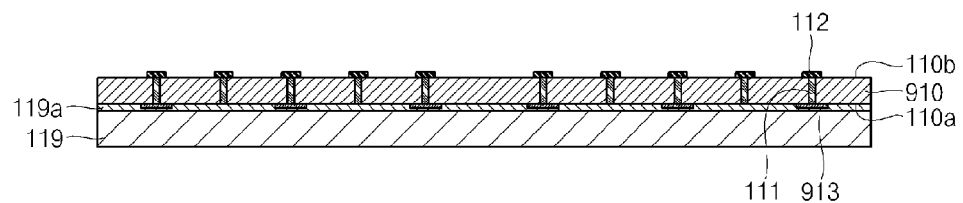

FIG. 13F illustrates a cross-sectional view of an exemplary conductive pad formation process S4 in the method of manufacturing the semiconductor device 900, in accordance with a representative embodiment of the present invention. The conductive pad formation process S4 of FIG. 13F may correspond to, for example, the conductive pad formation process S4 of the semiconductor device 100 illustrated in FIG. 3E.

Figure 13G:
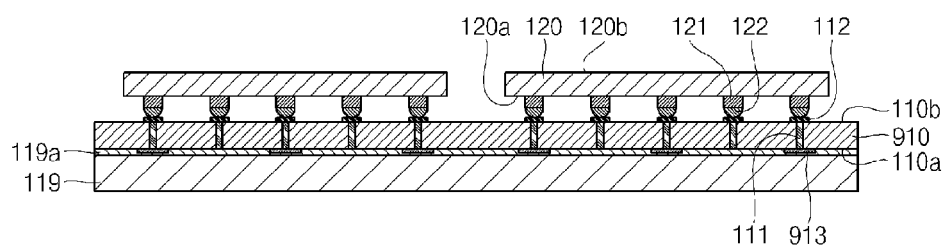

FIG. 13G illustrates a cross-sectional view of a second semiconductor die seat process S5 in the method of manufacturing the semiconductor device 900, in accordance with a representative embodiment of the present invention. The second semiconductor die seat process S5 of FIG. 13G may correspond to, for example, the second semiconductor die seat process S5 illustrated in FIG. 3F.

Figure 13H:
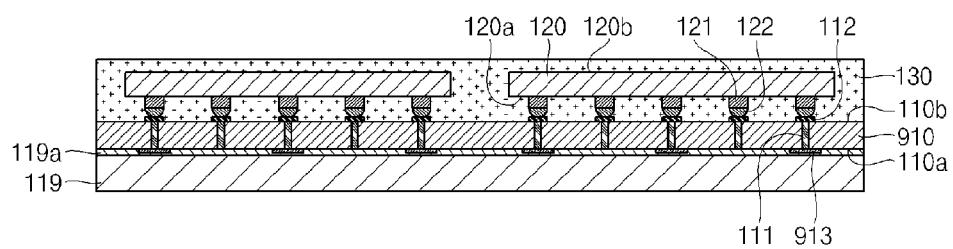

FIG. 13H illustrates a cross-sectional view of an exemplary encapsulation process S6 in the method of manufacturing the semiconductor device 900, in accordance with a representative embodiment of the present invention. The encapsulation process S6 of FIG. 13H may correspond to, for example, the encapsulation process S6 of the semiconductor device 100 illustrated in FIG. 3G.

Figure 13I:
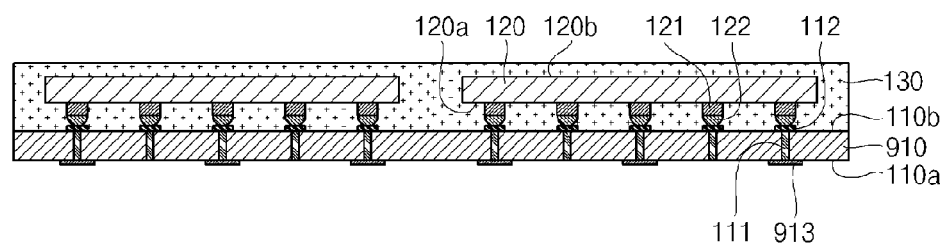

FIG. 13I illustrates a cross-sectional view of an exemplary carrier separation process S7 in the method of manufacturing the semiconductor device 900, in accordance with a representative embodiment of the present invention. In the carrier separation process S7 of FIG. 13I, the carrier 119 temporarily applied to the first surface 110a of the first semiconductor die 910 during the carrier adhesion process S2A of FIG. 13C, is removed. The carrier 119 may be separated from the first semiconductor die 910 after a predetermined stimulation is applied into the adhesive 119a to reduce the strength of adhesiveness. The adhesiveness of the adhesive 119a of the carrier 119 of FIG. 13C may be reduced, for example, by the thermal treatment performed for curing the first encapsulant 130 in the encapsulation process S6, however this approach does not necessarily represent a specific limitation of the present invention, unless explicitly recited in the claims. Also, in the carrier separation process S7 of FIG. 13I, the carrier 119 is separated and removed to expose the first surface 110a of the semiconductor die 910 to the external environment outside.

Figure 13J:
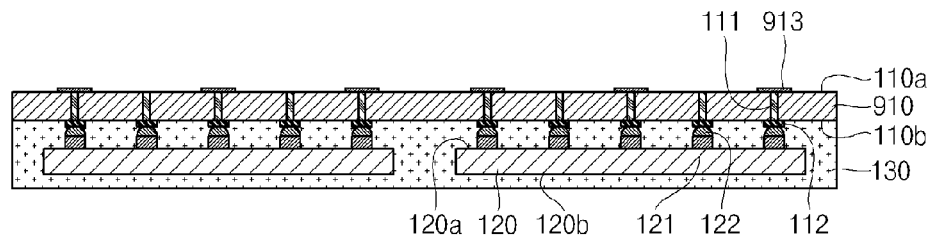
Figure 13K:
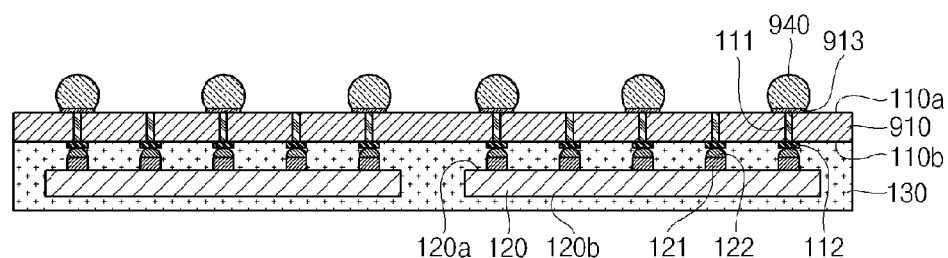

FIGS. 13J and 13K illustrate cross-sectional views of an exemplary conductive bump formation process S8A in the method of manufacturing the semiconductor device 900, in accordance with a representative embodiment of the present invention. In the conductive bump formation process S8A, as shown in FIG. 13J, the first semiconductor die 910 with the first encapsulant 130 covering the second surface 110b of the first semiconductor die 910 is overturned to allow the first surface 110a of the first semiconductor die 910 to be disposed facing an upper side. That is, the first semiconductor die 910 is disposed on an upper side, and the second semiconductor die 120 and the first encapsulant 130 are disposed on a lower side. Here, the first encapsulant 130 may function as a carrier for fixing the first semiconductor die 910 and the second semiconductor die 120 when the first and second semiconductor die 910 and 120 are moved using equipment for each of the processes of the method. Also, in the illustration of FIG. 13K, as in the conductive pillar formation process S8 of FIG. 2, one or more conductive bumps 940 are formed on the first surface 110a of the first semiconductor die 910 disposed on the upper side. In more detail, the conductive bumps 940 are connected to the under bump metal 913 and disposed on the first surface 110a of the first semiconductor die 910.

Figure 13L:
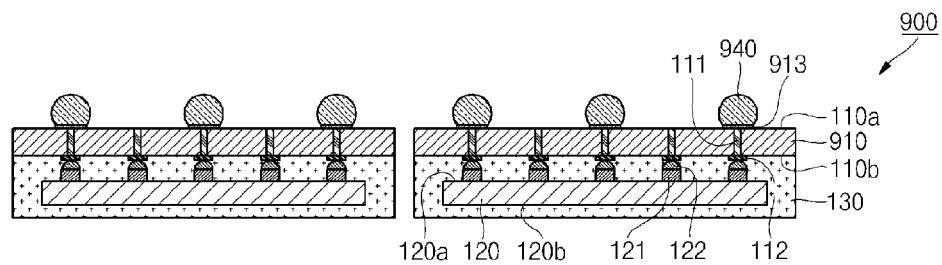

FIG. 13L illustrates a cross-sectional view of an exemplary singularization process S9 in the method of manufacturing the semiconductor device 900, in accordance with a representative embodiment of the present invention. In the singularization process S9 of FIG. 13L, a plurality of semiconductor devices are separated or diced into individual semiconductor devices 900 by using a dicing tool (not shown) such as a diamond wheel, a laser beam, or any other suitable means known now or in the future.

As described above, in the method of manufacturing the semiconductor device 900, the second semiconductor die 120 may be stacked on the first semiconductor die 910, and the first encapsulant 130 may be formed. The carrier 119 may then be removed. Thus, the carrier 119 may be easily removed when compared to a situation in which a carrier is removed from a wafer having a thin thickness. Also, in the method of manufacturing the semiconductor device 900 described above, because the carrier 119 is removed before the semiconductor devices are separated from one another, the carrier 119 may be easily removed when compared to the situation where a carrier 119 is removed after semiconductor devices are separated from each other.

Figure 14:
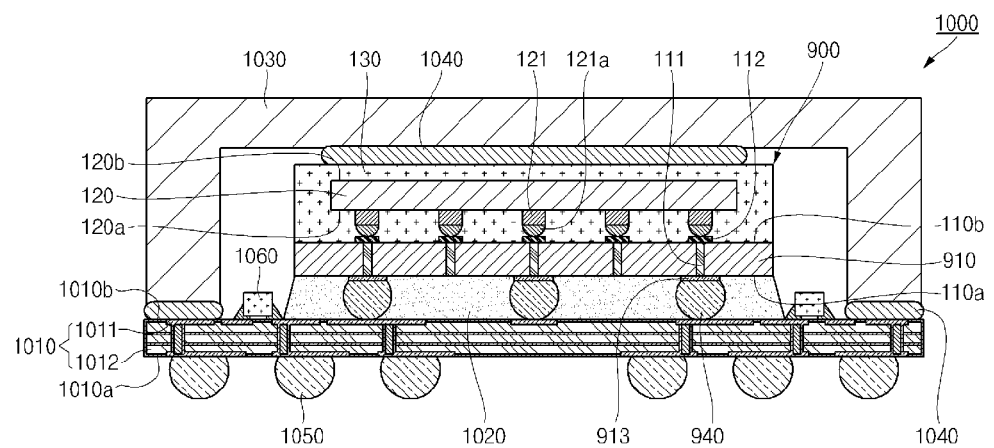
FIG. 14 illustrates a cross-sectional view of an exemplary semiconductor device, in accordance with a representative embodiment of the present invention.

FIG. 14 illustrates a cross-sectional view of an exemplary semiconductor device 1000, in accordance with a representative embodiment of the present invention. Referring to FIG. 14, the semiconductor device 1000 includes a semiconductor device 900, a circuit board 1010, an under fill 1020, a cover 1030, a thermally conductive adhesive 1040, and one or more solder balls 1050. The semiconductor device 900 has a configuration similar to that of the semiconductor device 900 of FIG. 11, and thus, will be referred to herein as a flip chip device.

The flip chip device 900 includes one or more conductive bumps 940 exposed to one surface thereof as described above. The conductive bumps 940 are mounted on a second surface 1010b of the circuit board 1010.

The circuit bard 1010 includes a circuit pattern 1011 and an insulation layer 1012. Furthermore, a passive device 1060 may be mounted on the circuit board 1010. Also, as described above, the one or more conductive bumps 940 of the flip chip device 900 may be electrically connected to the circuit pattern 1011 of the circuit board 1010.

The under fill 1020 is formed between the flip chip device 900 and the circuit board 1010. That is, the under fill 1020 surrounds the conductive bump 940 as well as covering a first surface 110a of a first semiconductor die 910 of the flip chip device 900. Thus, the under fill 1020 may prevent the flip chip device 900 and the circuit board 1010 from being separated from each other due to any stresses that may result from a difference in the coefficients of thermal expansion of the flip chip device 900 and the circuit board 1010.

As shown in the example of FIG. 14, the cover 1030 is attached to the circuit board 1010 to surround the flip chip device 900. Thus, the flip chip device 900 may be protected against the external environment by the cover 1030. The cover 1030 may, for example, be formed of a metal, a ceramic, or any suitable equivalent to improve heat dissipation performance. It should be noted that the materials listed here for the cover 1030 do not necessarily represent specific limitations of the present invention, unless explicitly recited in the claims, and that any suitable materials may be employed without departing from the spirit and scope of the present invention.

The thermally conductive adhesive 1040 is disposed between the flip chip device 900 and the cover 1030 and between the cover 1030 and the circuit board 1010. The thermally conductive adhesive 1040 may quickly transfer heat generated from the flip chip device 900 into the cover 1030. Also, the thermally conductive adhesive 1040 may fix the cover 1030 to the flip chip device 900 and the circuit board 1010.

As shown in FIG. 14, the one or more solder balls 1050 are disposed on a first surface 1010a of the circuit board 1010 opposite to the second surface 1010b on which the flip chip device 900 is mounted. That is, the solder balls 1050 may be electrically connected to the circuit pattern 1010 of the circuit board 1011. Due to presence of the solder balls 1050, a semiconductor device such as the semiconductor device 1000 of FIG. 14, in accordance with a representative embodiment of the present invention, may be mounted on, for example, a mother board or main board of electronic equipment such as a computer, a smart phone, and the like.

Figure 15:
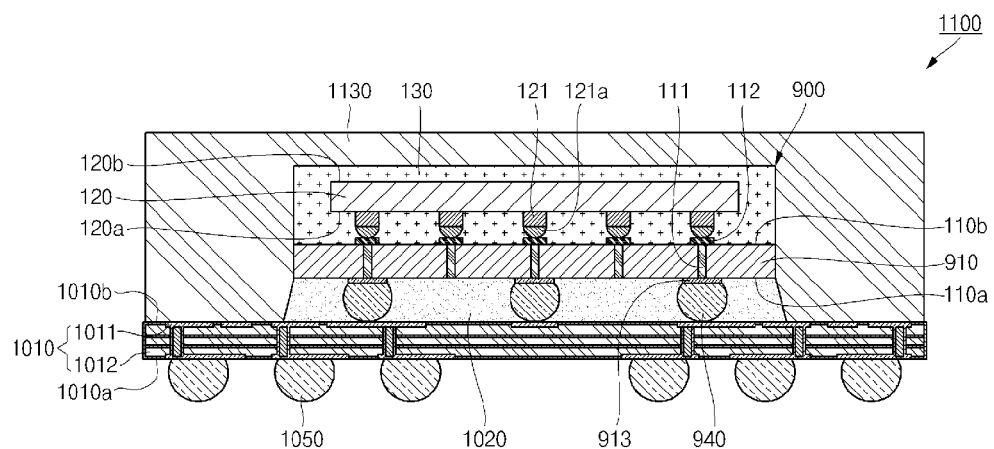
FIG. 15 illustrates a cross-sectional view of another exemplary semiconductor device, in accordance with a representative embodiment of the present invention.

FIG. 15 illustrates a cross-sectional view of an exemplary semiconductor device 1100, in accordance with a representative embodiment of the present invention. Referring to FIG. 15, the semiconductor device 1100 includes a flip chip device 900, a circuit board 1010, an under fill 1020, a second encapsulant 1130, and one or more solder balls 1050.

The flip chip device 900, the circuit board 1010, the under fill 1020, and the solder balls 1050 of the semiconductor device 1200 may correspond to similarly numbered elements of the semiconductor device 1000 of FIG. 14. Thus, the second encapsulant 1130 of the semiconductor device 1100, which is different in configuration from the semiconductor device 1000 of FIG. 14, will be mainly described.

In the illustration of FIG. 15, the second encapsulant 1130 is disposed in a manner to surround the flip chip device 900, the under fill 1020, and cover a second surface 1010b of the circuit board 1010. That is, the second encapsulant 1130 protects the flip chip device 900 and the circuit board 1010 against the external environment. Here, a first surface 1010a of the circuit board 1010 is exposed to the external environment outside of the second encapsulant 1130. That is, a surface of the circuit board 1010 on which the solder balls 1050 are disposed is exposed to the external environment outside. The second encapsulant 1130 may, for example, be formed using an epoxy-based resin that is an electrically non-conductive material.

Figure 16:
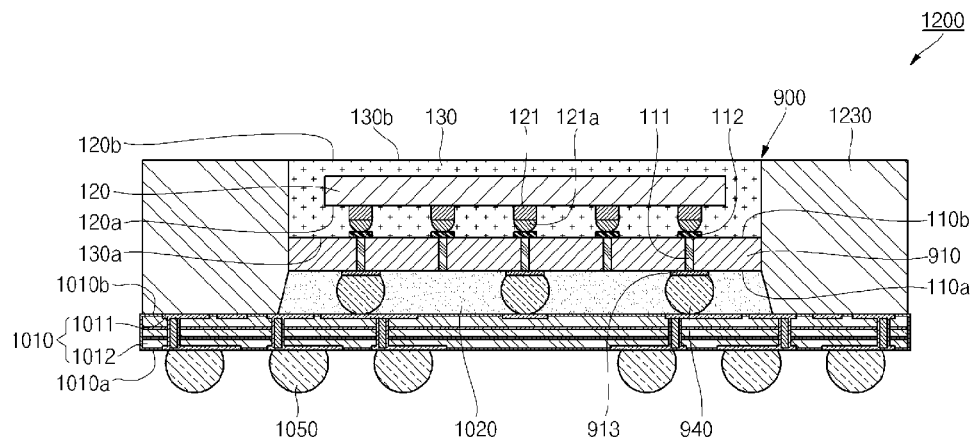
FIG. 16 illustrates a cross-sectional view of an exemplary semiconductor device, in accordance with a representative embodiment of the present invention.

FIG. 16 illustrates a cross-sectional view of an exemplary semiconductor device 1200, in accordance with a representative embodiment of the present invention. Referring to FIG. 16, the semiconductor device 1200 includes a flip chip device 900, a circuit board 1010, an under fill 1020, a second encapsulant 1230, and one or more solder balls 1050.

The flip chip device 900, the circuit board 1010, the under fill 1020, and the solder balls 1050 of the semiconductor device 1200 may correspond to similarly numbered elements of the semiconductor device 1100 of FIG. 15. Thus, the second encapsulant 1230 of the semiconductor device 1200, which is different in configuration from the semiconductor device 1100 of FIG. 15, will be mainly described.

In the example of FIG. 16, the second encapsulant 1230 is disposed in a manner to surround the flip chip device 900, the under fill 1020, and cover a second surface 1010b of the circuit board 1010. Here, a second surface 130b of a first encapsulant 130 is exposed to the external environment outside of the second encapsulant 1230. Also, a first surface 1010a of the circuit board 1010 on which the solder balls 1050 are disposed is exposed to the external environment outside. That is, the second encapsulant 1230 is disposed in a manner to surround a side surface of the flip chip device 900, the under fill 1020, and cover the second surface 1010b of the circuit board 1010, thereby protecting the flip chip device 900 and the circuit board 1010 against the external environment. The second encapsulant 1130 may, for example, be formed using, for example, an epoxy-based resin that is an electrically non-conductive material.

Figure 17:
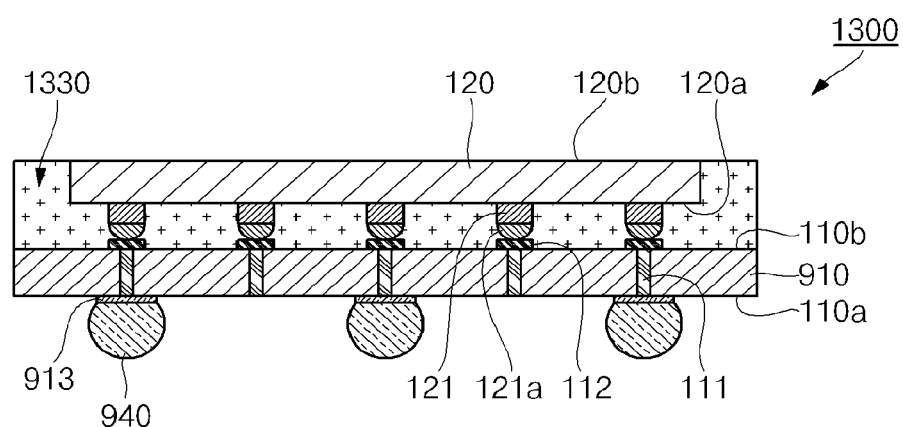
FIG. 17 illustrates a cross-sectional view of yet another exemplary semiconductor, in accordance with a representative embodiment of the present invention.

FIG. 17 illustrates a cross-sectional view of an exemplary semiconductor device 1300, in accordance with a representative embodiment of the present invention Referring to FIG. 17, the semiconductor device 1300 includes a first semiconductor die 910 where a plurality of through electrodes 111 and one or more conductive pads 112 are disposed, a second semiconductor die 120 on which one or more conductive pillars 121 are disposed, a first encapsulant 1330 surrounding a first surface 120a of the second semiconductor die 120, and one or more conductive bumps 940 disposed on the first semiconductor die 910.

The first semiconductor die 910, the second semiconductor die 120, and the conductive bumps 940 of the semiconductor device 1300 may correspond to the similarly numbered elements of the semiconductor device 900 of FIG. 11. Thus, the first encapsulant 1330 of the semiconductor device 1300, which is different in configuration from the semiconductor device 900 of FIG. 11, will be mainly described.

The first encapsulant 1330 is disposed in a manner to cover a second surface 110b of the first semiconductor die 910, the first surface 120a of the second die 120, and surround the conductive pillars 121. That is, the first encapsulant 1330 is disposed between the second surface 110b of the first semiconductor die 910 and the first surface 120a of the second semiconductor die 120. The first encapsulant 1330 protects any electrical connections between the second surface 110b of the first semiconductor die 910 and the first surface 120a of the second semiconductor die 120 against the external environment. Also, a first surface 110a of the first semiconductor die 910 and a second surface 120b of the second semiconductor die 120 are exposed to the external environment outside of the first encapsulant 1330. The first encapsulant 1330 may be formed of, for example, an epoxy-based resin that is an electrically non-conductive material.

Figure 18:
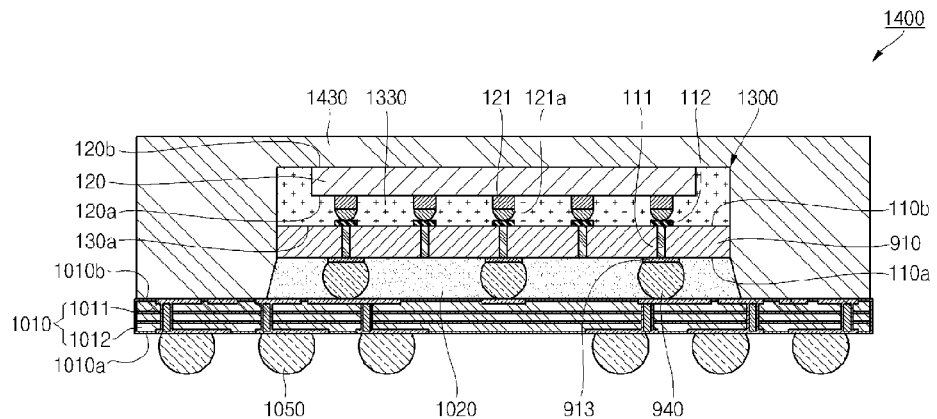
FIG. 18 illustrates a cross-sectional view of yet another exemplary semiconductor device, in accordance with a representative embodiment of the present invention.

FIG. 18 illustrates a cross-sectional view of an exemplary semiconductor device 1400, in accordance with a representative embodiment of the present invention. Referring to FIG. 18, the semiconductor device 1400 includes a semiconductor device 1300, a circuit board 1010, an under fill 1020, and one or more solder balls 1050. The semiconductor device 1300 of FIG. 18 has a configuration similar to that of the semiconductor device 1300 of FIG. 17, and thus, will be referred to herein as a flip chip device.

The flip chip device 1300 includes one or more conductive bumps 940 exposed to one surface thereof as described above. The conductive bumps 940 are mounted on a second surface 1010b of the circuit board 1010.

As shown in the example of FIG. 18, the circuit bard 1010 includes a circuit pattern 1011 and an insulation layer 1012. As described above, the conductive bumps 940 of the flip chip device 1300 may be electrically connected to the circuit pattern 1011 of the circuit board 1010.

In the example of FIG. 18, the under fill 1020 is formed between the flip chip device 1300 and the circuit board 1010. That is, the under fill 1020 is disposed on the circuit board 1010 to surround the conductive bumps 940 as well as cover a first surface 110a of a first semiconductor die 910 of the flip chip device 1300. Thus, the under fill 1020 may prevent the flip chip device 1300 and the circuit board 1010 from being separated from each other due to any stresses that result from a difference in the coefficients of thermal expansion of the flip chip device 1300 and the circuit board 1010.

The second encapsulant 1430 is disposed in a manner to surround the flip chip device 1300, the under fill 1020, and a second surface 1010b of the circuit board 1010. That is, the second encapsulant 1430 protects the flip chip device 1300 and the circuit board 1010 against the external environment. Here, a first surface 1010a of the circuit board 1010 is exposed to the external environment outside of the second encapsulant 1430. That is, the first surface 1010a of the circuit board 1010, on which the one or more solder balls 1050 are disposed, is exposed to the external environment outside. In some representative embodiments of the present invention, the second encapsulant 1430 may, for example, be formed of an epoxy-based resin that is an electrically non-conductive material.

As shown in FIG. 8, the one or more solder balls 1050 are disposed on a first surface 1010a of the circuit board 1010 opposite to the second surface 1010b on which the flip chip device 1300 is mounted. The solder balls 1050 may be electrically connected to the circuit pattern 1010 of the circuit board 1011. Due to presence of the solder balls 1050, a semiconductor device such as the semiconductor device 1400 of FIG. 18, in accordance with a representative embodiment of the present invention, may, for example, be mounted on a mother board or main board of electronic equipment such as a computer, a smart phone, and the like.

Figure 19:
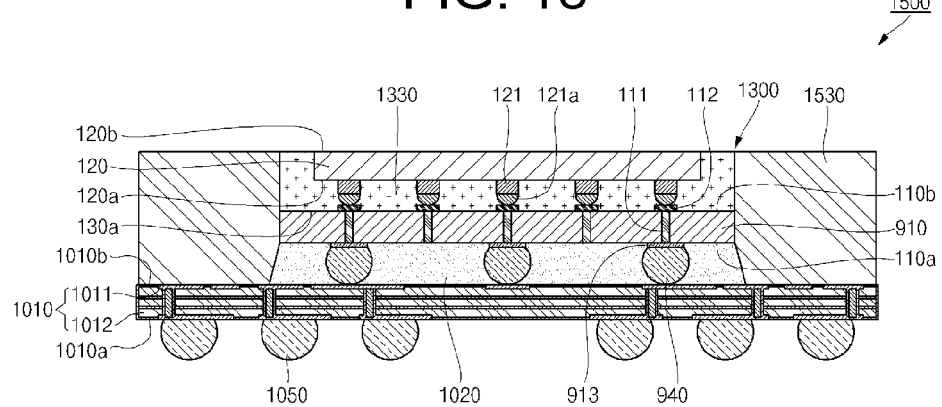
FIG. 19 illustrates a cross-sectional view of still another exemplary semiconductor device, in accordance with a representative embodiment of the present invention.

FIG. 19 illustrates a cross-sectional view of an exemplary semiconductor device 1500, in accordance with a representative embodiment of the present invention. Referring to FIG. 19, the semiconductor device 1500 includes a flip chip device 1300, a circuit board 1010, an under fill 1020, a second encapsulant 1530, and one or more solder balls 1050.

The flip chip device 1300, the circuit board 1010, the under fill 1020, and the solder balls 1050 of the semiconductor device 1500 may correspond to similar numbered elements of the semiconductor device 1400 of FIG. 18. Thus, the second encapsulant 1530 of the semiconductor device 1500, which is different in configuration from the semiconductor device 1400 of FIG. 18, will be mainly described.

In the example of FIG. 19, the second encapsulant 1530 is disposed in a manner to surround the flip chip device 1300, the under fill 1020, and cover a second surface 1010b of the circuit board 1010. Here, a second surface 120b of a second semiconductor die 120 of the flip chip device 1300 is exposed to the external environment outside of the second encapsulant 1530. Also, a first surface 1010a of the circuit board 1010 on which the one or more solder balls 1050 are disposed is exposed to the external environment outside. That is, the second encapsulant 1530 is disposed in a manner to surround a side surface of the flip chip device 1300, the under fill 1020, and cover the second surface 1010b of the circuit board 1010, thereby protecting the flip chip device 1300 and the circuit board 1010 against the external environment. In a representative embodiment of the present invention, the second encapsulant 1130 may, for example, be formed of an epoxy-based resin that is an electrically non-conductive material.

Figure 20:
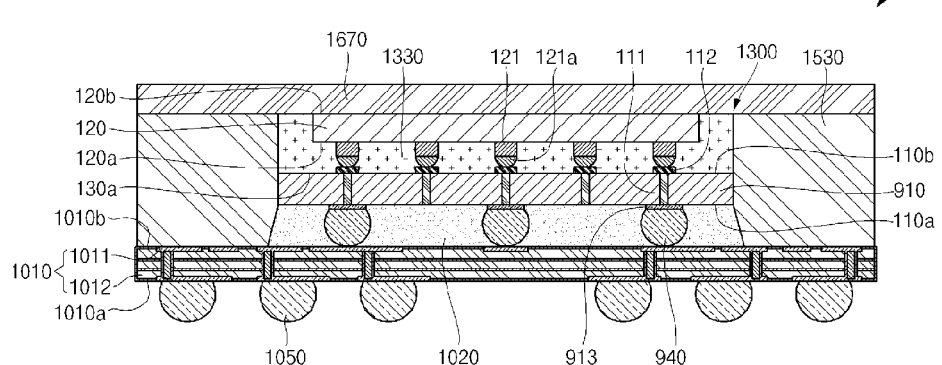
FIG. 20 illustrates a cross-sectional view of an exemplary semiconductor device, in accordance with a representative embodiment of the present invention.

FIG. 20 illustrates a cross-sectional view of an exemplary semiconductor device 1600, in accordance with a representative embodiment of the present invention. Referring to FIG. 20, the semiconductor device 1600 includes a flip chip device 1300, a circuit board 1010, an under fill 1020, a second encapsulant 1530, one or more solder balls 1050, and a cover 1670.

The flip chip device 1300, the circuit board 1010, the under fill 1020, the second encapsulant 1530, and the solder ball 1050 of the semiconductor device 1600 of FIG. 20 may correspond, for example, to similarly numbered elements of the semiconductor device 1500 of FIG. 19. Thus, the cover 1670 of the semiconductor device 1600, which is different in configuration from the semiconductor device 1500 of FIG. 19, will be mainly described.

In some representative embodiments of the present invention, a cover such as the cover 1670 may be attached to a second surface 120b of a second semiconductor die 120 of the flip chip device 1300. That is, the cover 1670 may be attached to the second surface 120b of the second semiconductor die 120 exposed to the external environment outside of the second encapsulant 1530. Thus, the second semiconductor die 120 of the flip chip device 1300 may be protected against external environments by the cover 1670. The cover 1670 may, for example, be formed of a metal, a ceramic, or any suitable equivalent to improve heat dissipation performance. It should be noted, however, that the mention of these materials does not represent a specific limitation of the present invention, unless explicitly recited in the claims, and that any other suitable materials, known now or in the future, may be employed without departing from the spirit and scope of the present invention. The cover 1670 may be attached to the second surface 120b of the second semiconductor die 120 of the flip chip device 1300 by, for example, a thermally conductive adhesive (not shown).

In the semiconductor device and the method of manufacturing the same according to the embodiments, because the carrier is removed after the first and second semiconductor devices are stacked on each other, and then the first encapsulant is formed, the carrier may be easily removed when compared to an arrangement where the carrier is removed from a wafer having a thin thickness.

Also, in the semiconductor device and the method of manufacturing the same according to the embodiments, because the carrier is removed before the semiconductor device is divided into the individual semiconductor devices or semiconductor die, it may be unnecessary to remove the carrier from the individual semiconductor devices or semiconductor die.

An aspect of the present invention provides a semiconductor device and a method of manufacturing the same, in which a carrier is capable of being removed from a wafer because the carrier is removed after first and second semiconductor devices are stacked on each other, and then a first encapsulant is formed, that is an improvement when compared with an approach in which a carrier is removed from a wafer having a thin thickness.

Another aspect of the present invention provides a semiconductor device and a method of manufacturing the same, in which it is unnecessary to remove a carrier from individual semiconductor devices or semiconductor die because the carrier is removed before the semiconductor device is divided into the individual semiconductor devices or semiconductor die.

According to one representative embodiment of the present invention, a method of manufacturing a semiconductor device includes: preparing a first semiconductor die having a through electrode exposed to a first surface; adhering a carrier to the first surface of the first semiconductor die; forming a conductive pad so that the conductive pad is connected to the through electrode exposed to a second surface opposite to the first surface of the first semiconductor die; seating a second semiconductor die on the second surface of the first semiconductor die so that a conductive pillar formed on a first surface of the second semiconductor die is connected to the conductive pad; encapsulating the second semiconductor die and the second surface of the first semiconductor die by using a first encapsulant to cover the second semiconductor die and the second surface of the first semiconductor die; and separating the carrier adhering to the first surface of the first semiconductor die.

The method may further include, after the adhering of the carrier, grinding the second surface of the first semiconductor die to expose the through electrode to the second surface of the first semiconductor die.

The method may further include, after the separating of the carrier, forming a conductive pillar on the first surface of the first semiconductor die so that the conductive pillar of the first semiconductor die is connected to the through electrode exposed to the first surface of the first semiconductor die.

The method may further include, after the forming of the conductive pillar of the first semiconductor die, dicing the first semiconductor die and the second semiconductor die, which are stacked on each other, to divide the first and second semiconductor die into individual semiconductor devices.

The method may further include, after the preparing of the first semiconductor die, forming a plurality of under bump metals so that each of the under bump metals is connected to the through electrode exposed to the first surface of the first semiconductor die, wherein, in the adhering of the carrier, the carrier may be attached to the first surface of the first semiconductor die by using an adhesive to cover the under bump metals.

The method may further include, after the adhering of the carrier, grinding the second surface of the first semiconductor die to expose the through electrode to the second surface of the first semiconductor die.

In the separating of the carrier, the carrier adhering to the first surface of the first semiconductor die may be separated to expose the under bump metals to the outside.

The method may further include, after separating of the carrier, forming a conductive bump on the first surface of the first semiconductor die so that the conductive bump is connected to each of the under bump metals.

The method may further include, after the forming of the conductive bump, dicing the first semiconductor die and the second semiconductor die, which are stacked on each other, to divide the first and second semiconductor die into individual semiconductor devices.

According to another representative embodiment of the present invention, a semiconductor device includes: a first semiconductor die having a first surface and a second surface opposite to the first surface, the first semiconductor die including a plurality of conductive pads disposed on the second surface and a plurality of through electrodes passing between the first surface and the second surface and respectively connected to the plurality of conductive pads; a second semiconductor die having a first surface on which a conductive pillar connected to each of the conductive pads is disposed; and a conductive member disposed on the second surface of the first semiconductor die, the conductive member being electrically connected to each of the through electrodes.

The conductive member may include a conductive pillar disposed on a second surface of the second semiconductor die and connected to each of the through electrodes.

The first semiconductor die may further include a plurality of under bump metals disposed on the first surface of the first semiconductor die and respectively connected to the through electrodes.

The conductive member may include a conductive bump disposed on a second surface of the second semiconductor die and connected to each of the under bump metals.

The semiconductor device may further include a first encapsulant covering the second surface of the first semiconductor die and the second semiconductor die.

The semiconductor device may further include a circuit board having a first surface and a second surface opposite to the first surface, wherein a conductive pattern exposed to the second surface may be connected to the conductive member.

An under fill may be formed or filled between the circuit board and the first semiconductor die.

The semiconductor device may further include a second encapsulant covering the second surface of the circuit board, the first semiconductor die, the second semiconductor die, and the first encapsulant.

A second surface of the first encapsulant may be exposed to the outside of the second encapsulant.

The semiconductor device may further include a cover attached to the circuit board to cover the second surface of the circuit board, the first semiconductor die, and the second semiconductor die.

The second surface of the second semiconductor die may be exposed to the outside of the first encapsulant.

The semiconductor device may further include a second encapsulant covering the second surface of the circuit board, the first semiconductor die, the second semiconductor die, and the first encapsulant.

The second surface of the second semiconductor die may be exposed to the outside of the second encapsulant.

The semiconductor device may further include a cover adhering to the second surface of the second semiconductor die exposed to the outside of the second encapsulant.

The semiconductor device may further include a cover attached to the circuit board to cover the second surface of the circuit board, the first semiconductor die, and the second semiconductor die.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A semiconductor device comprising:
a first semiconductor die having a first surface, a second surface opposite to the first surface, and a plurality of side surfaces connecting the first and second surfaces, the first semiconductor die comprising a plurality of conductive pads disposed on the second surface and a plurality of through electrodes passing between the first surface and the second surface and respectively connected to the plurality of conductive pads;
a second semiconductor die having a first surface on which a respective conductive pillar connected to each of the conductive pads is disposed, a second surface opposite the first surface of the second semiconductor die, and a plurality of side surfaces connecting the first and second surfaces of the second semiconductor die;
one or more conductive members disposed on the first surface of the first semiconductor die, each of the one or more conductive members being electrically connected to a respective one of the through electrodes;
a first encapsulant covering the second surface of the first semiconductor die and surrounding the side surfaces of the second semiconductor die; and
a second encapsulant surrounding the side surfaces of the first semiconductor die, the side surfaces of the second semiconductor die, and side surfaces of the first encapsulant that are entirely vertical,
wherein the second surface of the second semiconductor die is exposed from the first and second encapsulants, and wherein a surface of the first encapsulant and a surface of the second encapsulant are coplanar with the second surface of the second semiconductor die.

2. The semiconductor device as claimed in claim 1, further comprising a circuit board having a first surface and a second surface opposite to the first surface, wherein a conductive pattern exposed to the second surface is connected to the one or more conductive members.

3. The semiconductor device as claimed in claim 2, wherein the second encapsulant covers the second surface of the circuit board.

4. The semiconductor device as claimed in claim 1, further comprising a cover coupled to the second surface of the second semiconductor die.

5. The semiconductor device as claimed in claim 4, wherein the second encapsulant covers the second surface of the circuit board.

6. The semiconductor device as claimed in claim 5, wherein the cover is further coupled to the first and second encapsulants.

7. The semiconductor device as claimed in claim 6, further wherein the cover is attached to the second surface of the second semiconductor with thermally conductive adhesive.

8. A semiconductor device comprising:
a first semiconductor die comprising a plurality of through electrodes that electrically connect corresponding conductive members disposed on a first surface of the first semiconductor die to corresponding conductive pads disposed on a second surface of the first semiconductor die opposite the first surface;
a second semiconductor die having a first surface on which a respective conductive pillar connected to each of the conductive pads is disposed, the first surface of the second semiconductor die in opposition to the second surface of the first semiconductor die and electrically interconnected with circuitry on the second surface of the first semiconductor die via the conductive pads of the first semiconductor die;
a first encapsulant covering the second surface of the first semiconductor die and the second semiconductor die; and
a second encapsulant surrounding the first semiconductor die, the second semiconductor die, and the first encapsulant, wherein a surface of the first encapsulant and a surface of the second encapsulant are coplanar with a second surface of the second semiconductor die.

9. The semiconductor device as claimed in claim 8, further comprising a circuit board having a first surface and a second surface opposite to the first surface, wherein a conductive pattern of the circuit board exposed to the second surface is connected to the conductive members.

10. The semiconductor device as claimed in claim 8, wherein a second surface opposite the first surface of the second semiconductor die is exposed to the outside of the first encapsulant.

11. The semiconductor device as claimed in claim 10, wherein the second encapsulant covers the entire second surface of the circuit board.

12. The semiconductor device as claimed in claim 11, wherein the second surface of the second semiconductor die is exposed to the outside of the second encapsulant.

13. The semiconductor device as claimed in claim 12, further comprising a cover adhering to the second surface of the second semiconductor die exposed to the outside of the second encapsulant.

14. A semiconductor device comprising:
a first semiconductor die comprising a first surface, a second surface opposite the first surface, and one or more through electrodes electrically connecting one or more conductive members disposed on the first surface to corresponding conductive pads disposed on the second surface;
a circuit board comprising a first surface, a second surface opposite to the first surface, and a conductive pattern exposed to the second surface of the circuit board;
a second semiconductor die having a first surface on which a respective conductive pillar connected to each of the conductive pads is disposed, the first surface of the second semiconductor die electrically connected to the conductive pattern of the circuit board via the one or more through electrodes of the first semiconductor die;
a first encapsulant covering the second surface of the first semiconductor die and the second semiconductor die; and
a second encapsulant surrounding the first semiconductor die, the second semiconductor die, and the first encapsulant, and covering the second surface of the circuit board, and wherein a surface of the first encapsulant and a surface of the second encapsulant are coplanar with a second surface of the second semiconductor die.

15. The semiconductor device as claimed in claim 14, wherein the second encapsulant covers the entire second surface of the circuit board.

16. The semiconductor device as claimed in claim 14, wherein a second surface opposite the first surface of the second semiconductor die is exposed to the outside of the first encapsulant.

17. The semiconductor device as claimed in claim 16, wherein the second encapsulant covers the entire second surface of the circuit board.

18. The semiconductor device as claimed in claim 17, wherein the second surface of the second semiconductor die is exposed to the outside of the second encapsulant.

19. The semiconductor device as claimed in claim 18, further comprising a cover adhering to the second surface of the second semiconductor die exposed to the outside of the second encapsulant.

\* \* \* \* \*